United States Patent
Mimura

(10) Patent No.: US 11,855,606 B2
(45) Date of Patent: *Dec. 26, 2023

(54) ELASTIC WAVE DEVICE, HIGH FREQUENCY FRONT-END CIRCUIT, AND COMMUNICATION APPARATUS

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/942,212

(22) Filed: Sep. 12, 2022

(65) Prior Publication Data

US 2023/0006641 A1  Jan. 5, 2023

Related U.S. Application Data

(63) Continuation of application No. 17/065,572, filed on Oct. 8, 2020, now Pat. No. 11,482,984, which is a (Continued)

(30) Foreign Application Priority Data

Dec. 20, 2016  (JP) ................................ 2016-246267

(51) Int. Cl.
H03H 9/145  (2006.01)
H03H 9/02  (2006.01)
(Continued)

(52) U.S. Cl.
CPC ........ H03H 9/145 (2013.01); H03H 9/02559 (2013.01); H03H 9/25 (2013.01);
(Continued)

(58) Field of Classification Search
CPC ........... H03H 9/02559; H03H 9/02834; H03H 9/145; H03H 9/14541; H03H 9/25;
(Continued)

(56) References Cited

U.S. PATENT DOCUMENTS 10,840,880 B2 * 11/2020 Mimura ............. H03H 9/02559
11,482,984 B2 * 10/2022 Mimura ................... H04B 1/50
(Continued)

OTHER PUBLICATIONS

Mimura, "Elastic Wave Device, High Frequency Front-End Circuit, and Communication Apparatus", U.S. Appl. No. 17/065,572, filed Oct. 8, 2020.

*Primary Examiner* — Tan H Trinh
(74) *Attorney, Agent, or Firm* — Keating & Bennett, LLP

(57) ABSTRACT

An elastic wave device includes an $LiNbO_3$ substrate, a first elastic wave resonator including a first IDT electrode and a first dielectric film, and a second elastic wave resonator including a second IDT electrode and a second dielectric film. A Rayleigh wave travels along at least one surface of the elastic wave device. A thickness of the first dielectric film differs from a thickness of the second dielectric film. A propagation direction of an elastic wave in the first elastic wave resonator coincides with a propagation direction of an elastic wave in the second elastic wave resonator. Euler angles of the $LiNbO_3$ substrate fall within a range of $(0°\pm5°, \theta, 0°\pm10°)$.

12 Claims, 25 Drawing Sheets

Related U.S. Application Data continuation of application No. 16/443,919, filed on Jun. 18, 2019, now Pat. No. 10,840,880, which is a continuation of application No. PCT/JP2017/037558, filed on Oct. 17, 2017.

(51) Int. Cl.
| | |
|---|---|
| *H03H 9/25* | (2006.01) |
| *H03H 9/64* | (2006.01) |
| *H03H 9/72* | (2006.01) |
| *H04B 1/00* | (2006.01) |
| *H04B 1/04* | (2006.01) |
| *H04B 1/50* | (2006.01) |

(52) U.S. Cl.
CPC ............ *H03H 9/64* (2013.01); *H03H 9/6483* (2013.01); *H03H 9/725* (2013.01); *H04B 1/0057* (2013.01); *H04B 1/0475* (2013.01); *H04B 1/50* (2013.01); *H04B 2001/0408* (2013.01)

(58) Field of Classification Search
CPC ........ H03H 9/64; H03H 9/6483; H03H 9/725; H04B 1/0057; H04B 1/0475; H04B 1/50; H04B 2001/0408
USPC ........................................................ 455/307
See application file for complete search history.

(56) References Cited

U.S. PATENT DOCUMENTS

| | | | |
|---|---|---|---|
| 2014/0159833 A1* | 6/2014 | Ikeuchi | H03H 9/02803 333/195 |
| 2014/0218128 A1* | 8/2014 | Fujita | H03H 9/725 333/195 |
| 2016/0336919 A1* | 11/2016 | Taniguchi | H03H 9/02559 |
| 2018/0091118 A1* | 3/2018 | Saji | H03H 7/38 |
| 2018/0159494 A1* | 6/2018 | Goto | H03H 9/725 |

* cited by examiner

ELASTIC WAVE DEVICE, HIGH FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-246267 filed on Dec. 20, 2016 and is a Continuation Application of PCT Application No. PCT/JP2017/037558 filed on Oct. 17, 2017. The entire contents of each application are hereby incorporated herein by reference.

BACKGROUND OF THE INVENTION

1. Field of the Invention

The present invention relates to an elastic wave device using a Rayleigh wave, a high frequency front-end circuit including the elastic wave device, and a communication apparatus.

2. Description of the Related Art

Each of International Publication No. 2012/098816 and International Publication No. 2007/125734 discloses an elastic wave device using a Rayleigh wave.

The elastic wave device of International Publication No. 2012/098816 includes a series arm resonator and a parallel arm resonator each including an elastic wave resonator. In order to provide a filter device having a steep filter characteristic and a wide pass band, thicknesses of silicon oxide films defining the elastic wave resonators are different between the series arm resonator and the parallel arm resonator. Moreover, in order to reduce or prevent spurious noise within the pass band, the propagation direction of an elastic wave in the elastic wave resonator defining the series arm resonator is different from the propagation direction of an elastic wave in the elastic wave resonator defining the parallel arm resonator.

The elastic wave device disclosed in International Publication No. 2007/125734 is provided with an LiNbO$_3$ substrate and an electrode including an IDT (interdigital transducer) electrode mainly containing Au. It is described in International Publication No. 2007/125734 that θ of Euler angles (φ, θ, ψ) of the LiNbO$_3$ substrate and a thickness of the electrode have a specific relationship.

However, as described in International Publication No. 2012/098816, in a case where propagation directions of elastic waves are different from each other in a plurality of elastic wave resonators, the efficiency in arrangement of the elastic wave resonators on a chip is lowered, and it is difficult to miniaturize the elastic wave device.

Further, in a case where the propagation directions of elastic waves are different from each other in a plurality of elastic wave resonators including silicon oxide films of different thicknesses, spurious noise other than the target spurious noise to be reduced or prevented is generated within the pass band or in a vicinity of the pass band in some cases.

In International Publication No. 2007/125734, since the above-described specific relationship between the Euler angle θ and the electrode thickness holds across a wide range, in a case where the thicknesses of silicon oxide are different from each other in a plurality of elastic wave resonators, spurious noise caused by SH (Shear Horizontal) waves may be generated.

SUMMARY OF THE INVENTION

Preferred embodiments of the present invention provide elastic wave devices that are each capable of significantly reducing or preventing spurious noise caused by SH waves while providing a reduction in size, and has a steep filter characteristic and a wide pass band, to provide a high frequency front-end circuit including the above elastic wave device, and to provide a communication apparatus.

An elastic wave device according to a preferred embodiment of the present invention includes an LiNbO$_3$ substrate; a first elastic wave resonator including a first IDT electrode provided on the LiNbO$_3$ substrate and a first dielectric film provided to cover the first IDT electrode; and a second elastic wave resonator including a second IDT electrode provided on the LiNbO$_3$ substrate and a second dielectric film provided to cover the second IDT electrode. In the elastic wave device, a Rayleigh wave is used; a thickness of the first dielectric film differs from a thickness of the second dielectric film; a propagation direction of an elastic wave in the first elastic wave resonator coincides with a propagation direction of an elastic wave in the second elastic wave resonator; Euler angles (φ, θ, ψ) of the LiNbO$_3$ substrate fall within a range of (0°±5°, θ, 0°±10°); each of the first IDT electrode and the second IDT electrode includes a main electrode; in a case where a thickness of the main electrode normalized by a wave length λ that is determined by an electrode finger pitch of at least one of the first IDT electrode and the second IDT electrode is denoted as T, and a density ratio (ρ/ρ$_{Pt}$) of density of the main electrode (ρ) to density of Pt (ρ$_{Pt}$) is denoted as r, θ of the Euler angles (φ, θ, ψ) of the LiNbO$_3$ substrate satisfies the following expression (1) in a range of 0.055λ T×r≤0.10λ.

$$-0.033/(T \times r - 0.037) + 29.99 \leq \theta \leq -0.050/(T \times r - 0.043) + 32.45 \quad (1)$$

In an elastic wave device according to a preferred embodiment of the present invention, the first IDT electrode and the second IDT electrode include the same electrode material and have the same or substantially the same thickness.

In an elastic wave device according to a preferred embodiment of the present invention, ψ of the Euler angles (φ, θ, ψ) of the LiNbO$_3$ substrate falls within a range from about −2° to about 2°. In this case, it is possible to significantly reduce or prevent spurious noise different from the spurious noise caused by SH waves.

In an elastic wave device according to a preferred embodiment of the present invention, each of the first dielectric film and the second dielectric film mainly contains silicon oxide. In this case, frequency temperature characteristics may be further improved In an elastic wave device according to a preferred embodiment of the present invention, the first elastic wave resonator is a series arm resonator and the second elastic wave resonator is a parallel arm resonator, and a ladder filter is defined at least by the first elastic wave resonator and the second elastic wave resonator.

In an elastic wave device according to a preferred embodiment of the present invention, the elastic wave device is a duplexer that includes a transmission filter including the first elastic wave resonator, and a reception filter including the second elastic wave resonator.

A high frequency front-end circuit according to a preferred embodiment of the present invention includes an elastic wave device according to a preferred embodiment of the present invention and a power amplifier.

A communication apparatus according to a preferred embodiment of the present invention includes a high frequency front-end circuit according to a preferred embodiment of the present invention and an RF signal processing circuit.

Preferred embodiments of the present invention provide elastic wave devices, high frequency front-end circuits, and communication apparatuses, in which the elastic wave device is capable of significantly reducing or preventing spurious noise caused by SH waves while providing a reduction in size, and has a steep filter characteristic and a wide pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings.

It should be noted that the preferred embodiments described in the present specification are illustrative, and that the configurations and arrangements may be partially replaced or combined between different preferred embodiments.

Elastic Wave Device

Figure 1:
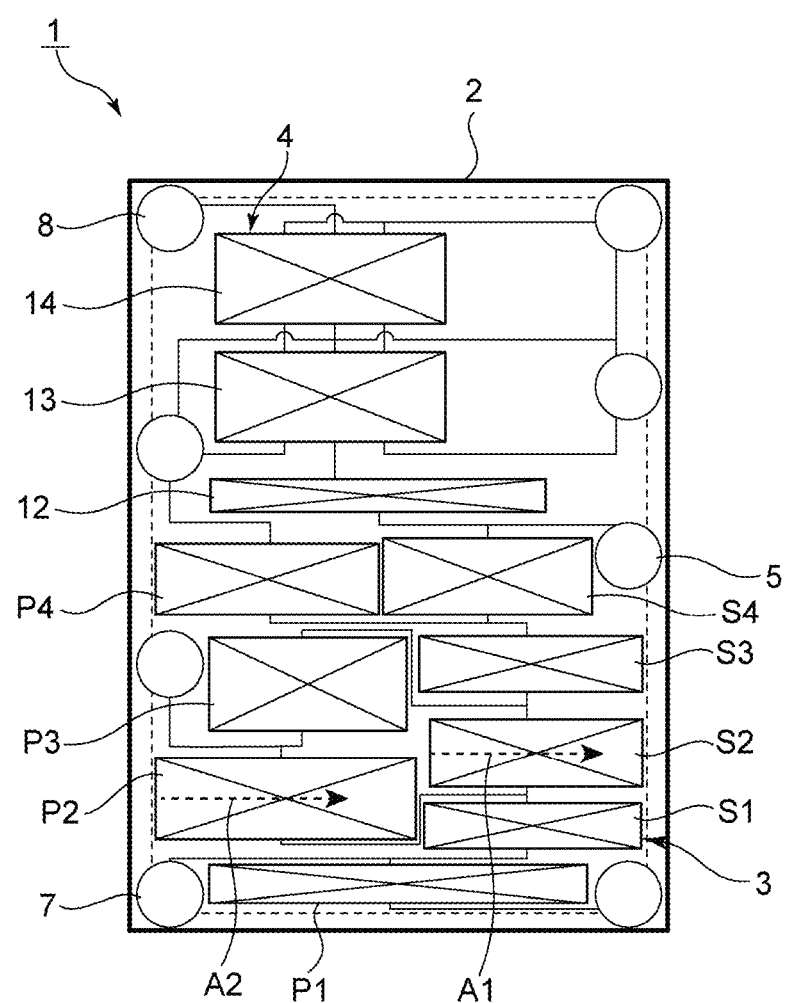
FIG. 1 is a schematic plan view of an elastic wave device according to a preferred embodiment of the present invention.
Figure 2A:
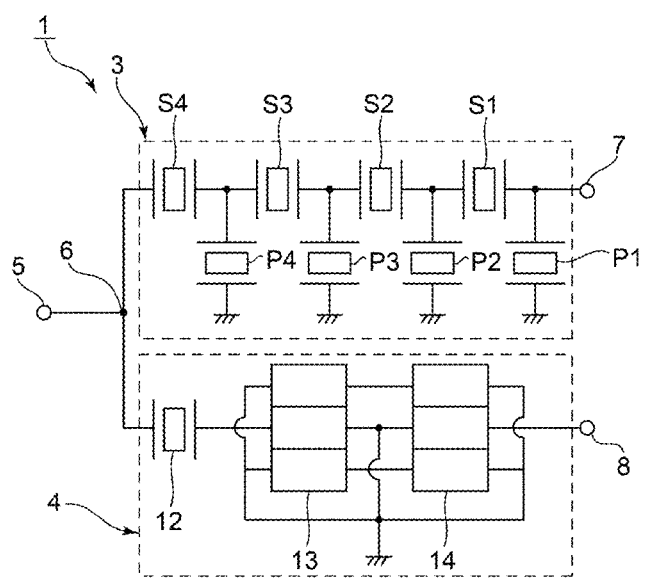
FIG. 2A is a circuit diagram of an elastic wave device according to a preferred embodiment of the present invention.
Figure 2B:
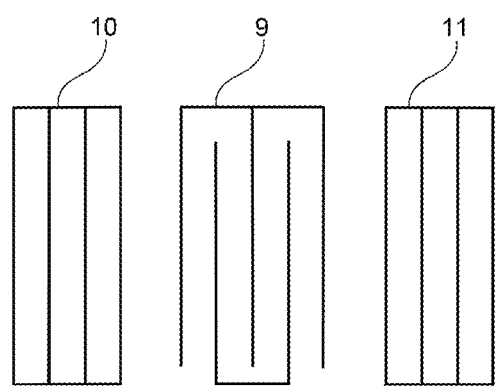
FIG. 2B is a schematic plan view illustrating an electrode structure of a one-port type elastic wave resonator.

FIG. 1 is a schematic plan view of an elastic wave device according to a preferred embodiment of the present invention. FIG. 2A is a circuit diagram of an elastic wave device according to a preferred embodiment of the present invention. FIG. 2B is a schematic plan view illustrating an electrode structure of a one-port type elastic wave resonator.

As illustrated in FIG. 1, an elastic wave device 1 includes an LiNbO$_3$ substrate 2 as a piezoelectric substrate. A transmission filter 3 and a reception filter 4 are provided on the LiNbO$_3$ substrate 2. The elastic wave device 1 is preferably, for example, a duplexer including the transmission filter 3 and the reception filter 4. The elastic wave device 1 makes use of a Rayleigh wave. That is, a Rayleigh wave travels along at least one surface of the elastic wave device 1.

As illustrated in FIG. 2A, the elastic wave device 1 includes an antenna terminal 5. A shared terminal 6 is electrically connected to the antenna terminal 5. The transmission filter 3 is provided between the shared terminal 6 and a transmission terminal 7. The reception filter 4 is provided between the shared terminal 6 and a reception terminal 8.

The transmission filter 3 is preferably a ladder circuit, for example. Specifically, the transmission filter 3 includes series arm resonators S1 to S4 and parallel arm resonators P1 to P4. The series arm resonators S1 to S4 are electrically connected in series between the antenna terminal 5 and the transmission terminal 7. Note that in FIG. 1, the series arm resonators S1 to S4 and the parallel arm resonators P1 to P4 are indicated by a symbol in which an "X" mark is surrounded by a rectangular frame.

Referring back to FIGS. 2A and 2B, the parallel arm resonator P1 is electrically connected between an electrical connection point of the transmission terminal 7 and the series arm resonator S1, and a ground potential. The parallel arm resonator P2 is electrically connected between an electrical connection point of the series arm resonator S1 and the series arm resonator S2, and the ground potential. The parallel arm resonator P3 is electrically connected between an electrical connection point of the series arm resonator S2 and the series arm resonator S3, and the ground potential. The parallel arm resonator P4 is electrically connected between an electrical connection point of the series arm resonator S3 and the series arm resonator S4, and the ground potential.

The series arm resonators S1 to S4 and the parallel arm resonators P1 to P4 are each preferably defined by a one-port type elastic wave resonator, for example.

The one-port type elastic wave resonator includes an electrode structure as illustrated in FIG. 2B. Specifically, an IDT electrode 9 and reflectors 10, 11 located on both sides in the elastic wave propagation direction of the IDT electrode 9, are provided on the LiNbO$_3$ substrate 2. With this, the one-port type elastic wave resonator is provided.

Note that the reflectors 10, 11 may not be provided.

Meanwhile, in the reception filter 4, a one-port type elastic wave resonator 12 defining a trap is electrically connected to the shared terminal 6. Three-IDT longitudinally coupled resonator elastic wave filter units 13 and 14 are provided between the one-port elastic wave resonator 12 and the reception terminal 8. The longitudinally coupled resonator elastic wave filter units 13 and 14 are electrically connected to each other in a cascading electrical connection. Each of the longitudinally coupled resonator elastic wave filter units 13 and 14 includes three IDT electrodes. The longitudinally coupled resonator elastic wave filter units 13 and 14 may be a five-IDT type including five IDT electrodes, or may be an n-IDT type including n IDT electrodes (n>1).

Although the transmission filter 3 includes a ladder circuit and the reception filter 4 includes a longitudinally coupled resonator elastic wave filter, the transmission filter 3 may include a longitudinally coupled resonator elastic wave filter and the reception filter 4 may include a ladder circuit.

Next, elastic wave resonators defining the series arm resonators S1 to S4 and the parallel arm resonators P1 to P4 will be described with reference to FIG. 3 and FIG. 4.

Figure 3:
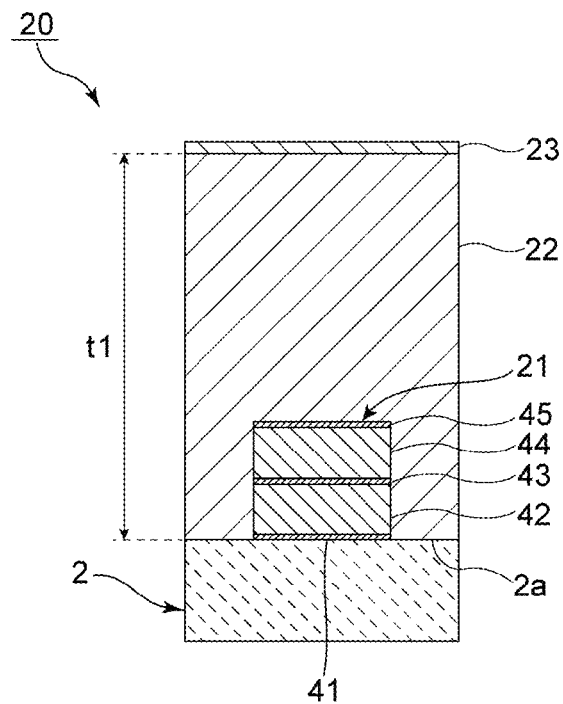
FIG. 3 is a schematic cross-sectional view illustrating a first elastic wave resonator defining a series arm resonator in an elastic wave device according to a preferred embodiment of the present invention.

FIG. 3 is a schematic cross-sectional view illustrating a first elastic wave resonator defining a series arm resonator in an elastic wave device according to a preferred embodiment of the present invention. FIG. 4 is a schematic cross-sectional view illustrating a second elastic wave resonator defining a parallel arm resonator in an elastic wave device according to a preferred embodiment of the present invention.

As illustrated in FIG. 3, a first elastic wave resonator 20 includes a LiNbO$_3$ substrate 2, a first IDT electrode 21, a first dielectric film 22, and a first frequency adjustment film 23. The first IDT electrode 21 is provided on a main surface 2a of the LiNbO$_3$ substrate 2. The first dielectric film 22 covers the first IDT electrode 21. The first frequency adjustment film 23 is provided on the first dielectric film 22.

Figure 4:
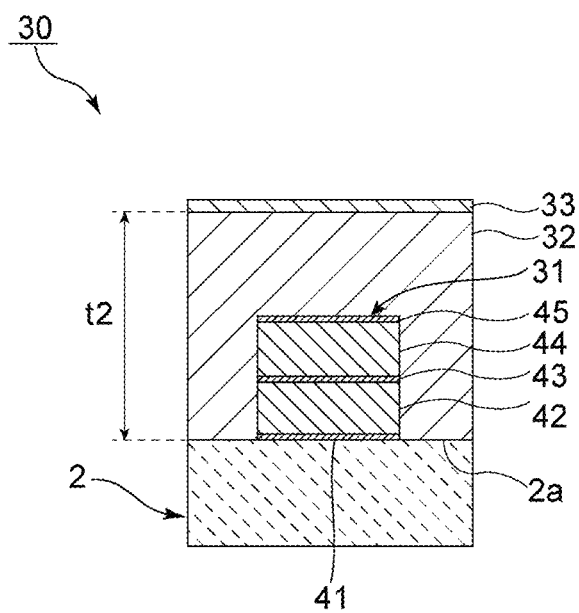
FIG. 4 is a schematic cross-sectional view illustrating a second elastic wave resonator defining a parallel arm resonator in an elastic wave device according to a preferred embodiment of the present invention.

As illustrated in FIG. 4, a second elastic wave resonator 30 includes the LiNbO$_3$ substrate 2, a second IDT electrode 31, a second dielectric film 32, and a second frequency adjustment film 33. The second IDT electrode 31 is provided on the main surface 2a of the LiNbO$_3$ substrate 2. The second dielectric film 32 covers the second IDT electrode 31. The second frequency adjustment film 33 is provided on the second dielectric film 32. The first elastic wave resonator 20 and the second elastic wave resonator 30 share the LiNbO$_3$ substrate 2.

As illustrated in FIGS. 3 and 4, a thickness t1 of the first dielectric film 22 in the first elastic wave resonator 20 is preferably thicker than a thickness t2 of the second dielectric film 32 in the second elastic wave resonator 30 (t1>t2). However, the thickness t2 of the second dielectric film 32 may be thicker than the thickness t1 of the first dielectric film 22. In other words, it is sufficient that the thickness t1 of the first dielectric film 22 is different from the thickness t2 of the second dielectric film 32. As discussed above, in the present preferred embodiment, since the thickness t1 of the first dielectric film 22 and the thickness t2 of the second dielectric film 32 are different from each other, steepness is able to be enhanced in the filter characteristic, and the pass band width is able to be widened.

For example, in order to provide a filter characteristic having high steepness at a higher frequency side of the pass band in a ladder filter, it is preferable to reduce Δf (a difference between a resonant frequency and an anti-resonant frequency) of an elastic wave resonator defining a series arm resonator. Since Δf is able to be reduced by increasing the film thickness of the dielectric film covering the main surface of the piezoelectric substrate (LiNbO$_3$ substrate) and the IDT electrode, the film thickness of the dielectric film on the series arm resonator is increased. On the other hand, in a case of using an elastic wave resonator with Δf being small, the band width of the filter is reduced, and it is preferable, for example, to increase Δf of the elastic wave resonator defining the parallel arm resonator. For this purpose, the film thickness of the dielectric film on the parallel arm resonator is reduced.

Meanwhile, in order to provide a filter characteristic having high steepness at a lower frequency side of the pass band, it is preferable to reduce Δf of an elastic wave resonator defining a parallel arm resonator. For this purpose, the film thickness of the dielectric film on the parallel arm resonator is increased. In contrast, in order to widen the band width of the filter, the film thickness of the dielectric film on the series arm resonator is reduced, thus increasing Δf of the series arm resonator.

Then, by setting the film thicknesses of the dielectric films to be different from each other between the series arm resonator and the parallel arm resonator as described above, steepness in the filter characteristic is able to be enhanced, and the pass band width is able to be widened.

The above description applies not only to a ladder filter, but also similarly applies to a longitudinally coupled resonator elastic wave filter. In this case, for example, by setting the thickness of a dielectric film covering an IDT electrode in the one-port type elastic wave resonator 12 in FIG. 2A to be thicker than the thicknesses of dielectric films covering IDT electrodes in the longitudinally coupled resonator elastic wave filter units 13 and 14, steepness in the filter characteristic is able to be enhanced and the pass band width is able to be widened.

As described above, in the present preferred embodiment, since the thickness t1 of the first dielectric film 22 differs from the thickness t2 of the second dielectric film 32, steepness in the filter characteristic is able to be enhanced and the pass band width is able to be widened.

Note that there is no particular limitation on a method by which the thickness t1 of the first dielectric film 22 and the thickness t2 of the second dielectric film 32 are different from each other on the identical LiNbO$_3$ substrate 2, and a non-limiting method as follows may be used, for example.

First, the first IDT electrode 21 and the second IDT electrode 31 are formed on the LiNbO$_3$ substrate 2. At the time of forming the first IDT electrode 21 and the second IDT electrode 31, the first IDT electrode 21 and the second IDT electrode 31 are film-formed simultaneously or substantially simultaneously. Therefore, the first IDT electrode 21 and the second IDT electrode include the same electrode material and have the same or substantially the same thickness.

Here, since the electrode material of the first IDT electrode 21 is the same as the electrode material of the second IDT electrode 31, the first IDT electrode 21 and the second IDT electrode 31 are film-formed at the same time, including a case where impurities are mixed in the material during the manufacturing process, or the like.

In addition, since the thickness of the first IDT electrode 21 is the same or substantially the same as the thickness of the second IDT electrode 31, the first IDT electrode 21 and the second IDT electrode 31 are film-formed at the same time, an error in thickness generated during the manufacturing process, mounting process, or the like is also included.

A dielectric film is formed to cover the first IDT electrode 21 and the second IDT electrode 31 on the LiNbO$_3$ substrate 2. Subsequently, a resist film is formed on the dielectric film of the elastic wave resonator whose thickness is to be large. Next, by etching the dielectric film, the thickness of a portion of the dielectric film where the resist film is not formed is reduced. Finally, the resist film is removed to provide dielectric films with different thicknesses.

Further, after the dielectric film is formed on the LiNbO$_3$ substrate 2, a resist film may be formed on the dielectric film of the elastic wave resonator whose thickness is to be small, and then a dielectric film may be further film-formed thereon. Also in this case, dielectric films with different thicknesses are able to be provided by removing the resist.

In the present preferred embodiment, all of the series arm resonators S1 to S4 are defined by the first elastic wave resonator 20. Further, all of the parallel arm resonators P1 to P4 are defined by the second elastic wave resonator 30. Note that, however, it is sufficient that at least one of the series arm resonators S1 to S4 is defined by the first elastic wave resonator 20. Further, it is sufficient that at least one of the parallel arm resonators P1 to P4 is defined by the second elastic wave resonator 30. In addition, at least one resonator defining the transmission filter 3 may be defined by the first elastic wave resonator 20, and at least one resonator defining the reception filter 4 may be defined by the second elastic wave resonator 30. In any case, the advantageous effects of the present invention are able to be provided.

The first IDT electrode 21 and the second IDT electrode 31 preferably include the same electrode material and have the same or substantially the same thickness.

The material of the first IDT electrode 21 and the second IDT electrode 31 is not particularly limited, and examples thereof include Au, Pt, Ag, Ta, W, Ni, Ru, Pd, Cr, Mo, Zn, Ti, Ni, Cr, Cu, Al, and an alloy of these metals. The first IDT electrode 21 and the second IDT electrode 31 may be a single-layer metal film or a laminated metal film in which two or more kinds of metal films are laminated.

In the present preferred embodiment, each of the first IDT electrode 21 and the second IDT electrode 31 is preferably a laminated metal film in which a close contact layer 41, a main electrode 42, a close contact layer 43, a conductive auxiliary film 44, and a close contact layer 45 are laminated in that order from the LiNbO$_3$ substrate 2 side. The main electrode 42 is an electrode layer that occupies the largest mass in the IDT electrode.

As a material of the close contact layers 41, 43, and 45, for example, Ti, Cr, or NiCr may preferably be included.

The material of the main electrode 42 is not particularly limited, and a metal having a relatively high density such as Au, Pt, Ag, Ta, W, Ni, Ru, Pd, Cr, Mo, Zn or Cu, or an alloy of these metals may preferably be included.

The material of the conductive auxiliary film 44 is not particularly limited, and Al, Cu, or an alloy thereof may preferably be included, for example.

Note that the close contact layers 41, 43 and 45, and the conductive auxiliary film 44 may not be provided.

The first dielectric film 22 and the second dielectric film 32 improve frequency temperature characteristics. The material of the first dielectric film 22 and the second dielectric film 32 is not particularly limited, and a material containing, for example, silicon oxide or silicon oxynitride as a primary component may be included. In this specification, the primary component refers to a component contained in an amount of equal to or more than about 50%. In the present preferred embodiment, both of the first dielectric film 22 and the second dielectric film 32 are preferably a silicon oxide film, for example.

The first frequency adjustment film 23 and the second frequency adjustment film 33 adjust frequencies. The material of the first frequency adjustment film 23 and the second frequency adjustment film 33 is not particularly limited, and silicon nitride or aluminum oxide, for example, may preferably be included. In the present preferred embodiment, both of the first frequency adjustment film 23 and the second frequency adjustment film 33 are preferably a silicon nitride film, for example.

Note that the first frequency adjustment film 23 and the second frequency adjustment film 33 may not be provided.

In the elastic wave device 1, the propagation direction of the elastic wave in the first elastic wave resonator 20 defining the series arm resonators S1 to S4 coincides with the propagation direction of the elastic wave in the second elastic wave resonator defining the parallel arm resonators P1 to P4. More specifically, the propagation direction of the elastic wave in the first elastic wave resonator 20 is a propagation direction A1 as illustrated in FIG. 1. The propagation direction of the elastic wave in the second elastic wave resonator 30 is a propagation direction A2 as illustrated in FIG. 1. In FIG. 1, the propagation direction A1 and the propagation direction A2 coincide with each other. In this specification, the expression "to coincide with each other" means a situation in which an angle between the propagation direction A1 and the propagation direction A2 falls within a range smaller than about 2°, and also includes a case where the propagation direction A1 and the propagation direction A2 does not completely coincide. However, in the present preferred embodiment, the propagation direction A1 preferably completely coincides with the propagation direction A2.

As described above, in the elastic wave device 1, since the propagation direction A1 of the elastic wave in the first elastic wave resonator 20 coincides with the propagation direction A2 of the elastic wave in the second elastic wave resonator 30, it is possible to miniaturize the elastic wave device 1.

In the present preferred embodiment, Euler angles ($\varphi$, $\theta$, $\psi$) of the LiNbO$_3$ substrate 2 preferably fall within a range of (0°±5°, $\theta$, 0°±10°), for example. In particular, $\theta$ of the Euler angles ($\varphi$, $\theta$, $\psi$) of the LiNbO$_3$ substrate 2 satisfies the following expression (1) in a range of about 0.055$\lambda \leq$T×r$\leq$ about 0.10$\lambda$. Note that T is a thickness of the main electrode 42 of each of the first IDT electrode 21 and the second IDT electrode 31.

Although the first IDT electrode 21 and the second IDT electrode 31 preferably include the same electrode material and to have the same or substantially the same thickness, a portion of the components of the electrode material may change to different matter or the film thickness thereof may change to a different value during the manufacturing process, mounting process, or the like. In such case, any of the electrodes may take the thickness T, or any of the electrodes may take density r. In this specification, the thickness refers to a thickness normalized by a wave length $\lambda$ that is determined by an electrode finger pitch of the IDT electrode. Further, r is a density ratio ($\rho/\rho_{Pt}$) of density of the main electrode 42 ($\rho$) to density of Pt ($\rho_{Pt}$).

$$-0.033/(T \times r-0.037)+29.99 \leq \theta \leq -0.050/(T \times r-0.043)+32.45 \quad (1)$$

In the present preferred embodiment, since $\theta$ of the Euler angles of the LiNbO$_3$ substrate 2 falls within the above range, spurious noise caused by SH waves may be significantly reduced or prevented. Accordingly, with the elastic wave device 1, a steep filter characteristic and a wide pass band may be provided, and a significant reduction or prevention of spurious noise caused by SH waves is able to be provided while providing the miniaturization.

Preferably, for example, $\psi$ of the Euler angles ($\varphi$, $\theta$, $\psi$) of the LiNbO$_3$ substrate 2 fall within a range from about −2° to about 2°. When iv of the Euler angles falls within the above range, it is possible to further significantly reduce or prevent spurious noise that is different from the spurious noise caused by the SH waves.

Next, the miniaturization provided by causing the propagation direction A1 and the propagation direction A2 to coincide with each other is described with reference to FIG. 5 and FIG. 6.

Figure 5:
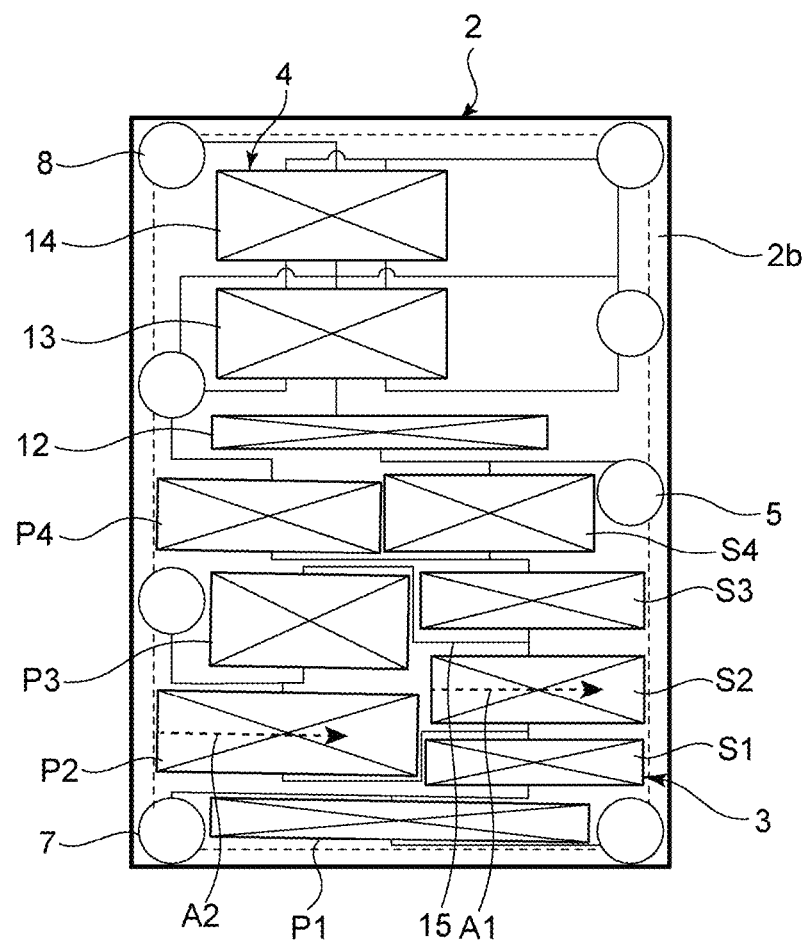
FIG. 5 is a schematic plan view when a propagation direction of an elastic wave in the second elastic wave resonator is slanted by about 1° relative to a propagation direction of an elastic wave in the first elastic wave resonator.

FIG. 5 is a schematic plan view when the propagation direction of the elastic wave in the second elastic wave resonator is slanted by about 1° relative to the propagation direction of the elastic wave in the first elastic wave resonator. FIG. 6 is a schematic plan view when the propagation direction of the elastic wave in the second elastic wave resonator is slanted by about 2° relative to the propagation direction of the elastic wave in the first elastic wave resonator. In FIGS. 5 and 6, an end portion 2b in an outer side portion relative to a broken line in the LiNbO$_3$ substrate 2 is a portion where an electrode pattern is not able to be provided.

Figure 6:
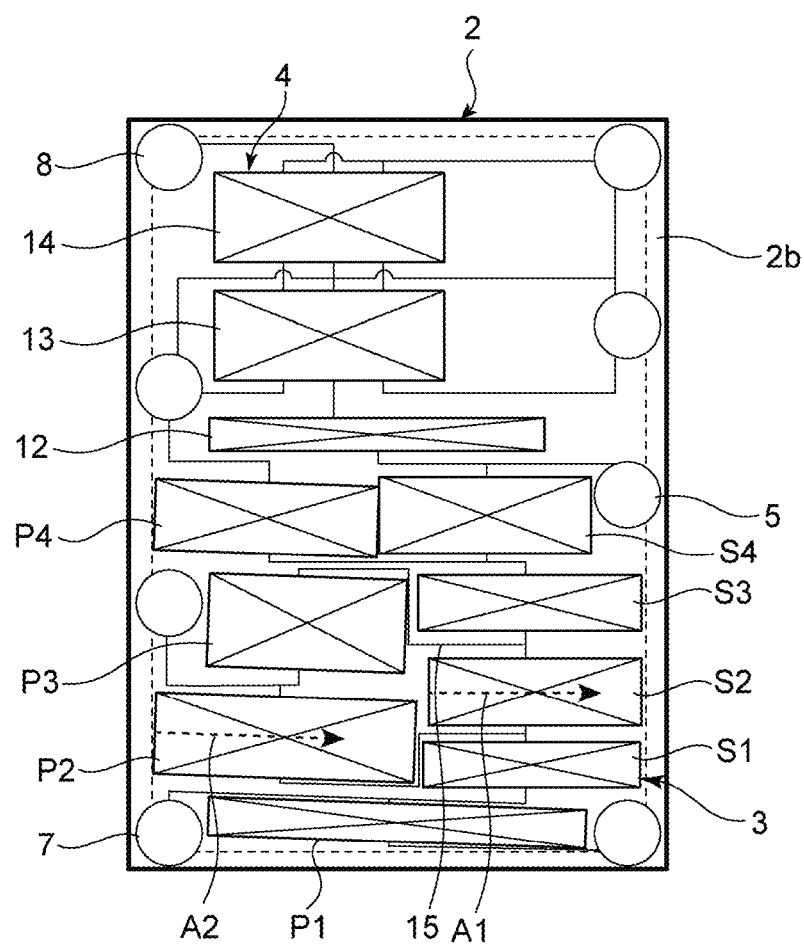
FIG. 6 is a schematic plan view when a propagation direction of an elastic wave in the second elastic wave resonator is slanted by about 2° relative to a propagation direction of an elastic wave in the first elastic wave resonator.
Figure 7A:
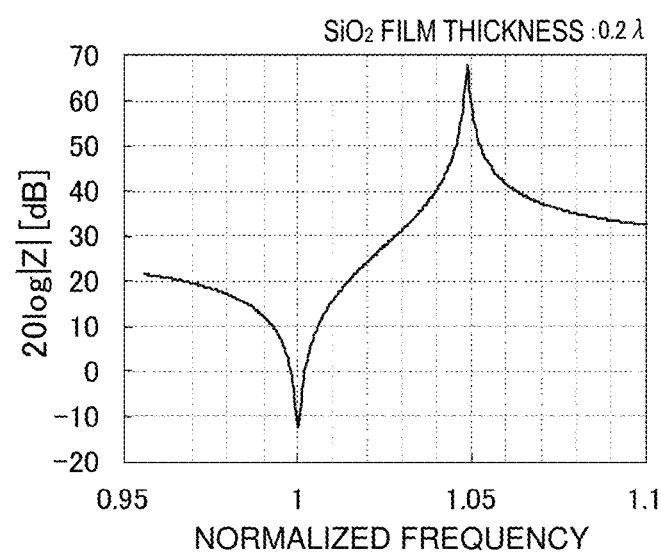
FIG. 7A is a graph showing impedance characteristics of a case where a thickness of an $SiO_2$ film is about $0.2\lambda$.
Figure 7B:
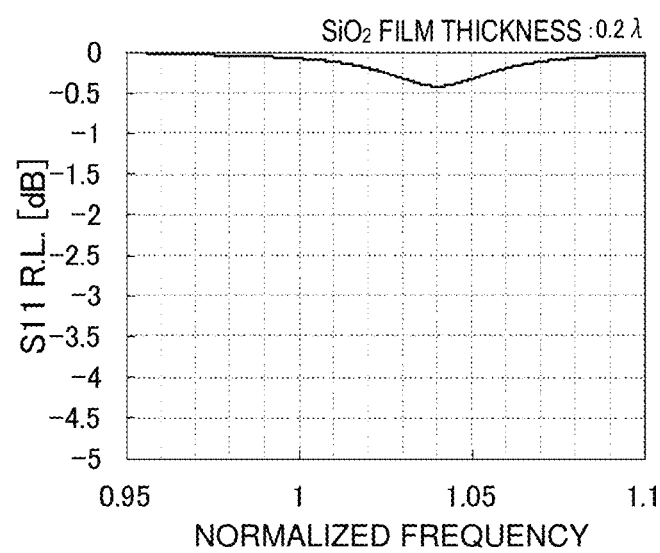
FIG. 7B is a graph showing return loss characteristics thereof.
Figure 8A:
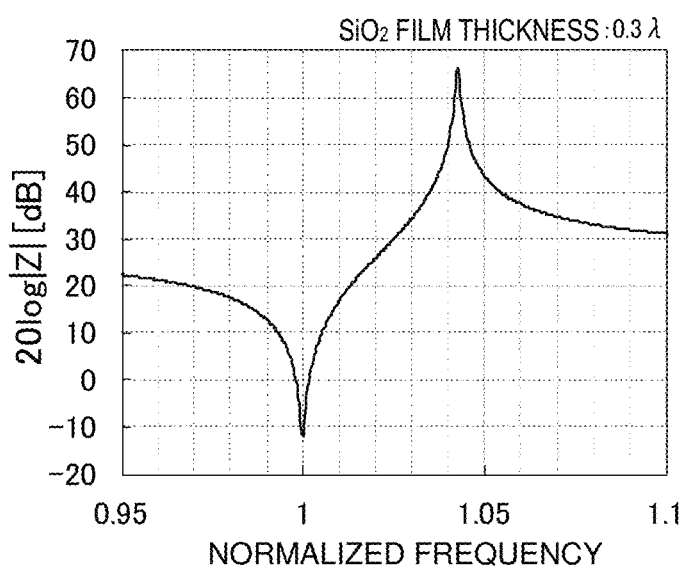
FIG. 8A is a graph showing impedance characteristics of a case where a thickness of an $SiO_2$ film is about $0.3\lambda$.
Figure 8B:
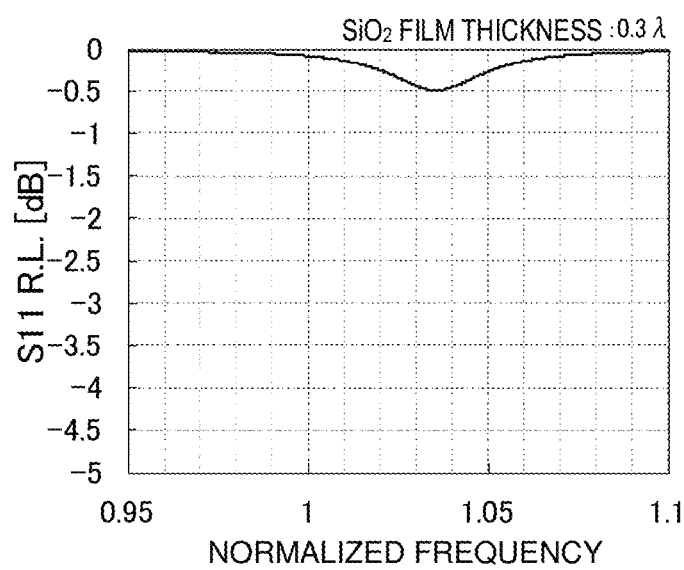
FIG. 8B is a graph showing return loss characteristics thereof.
Figure 9A:
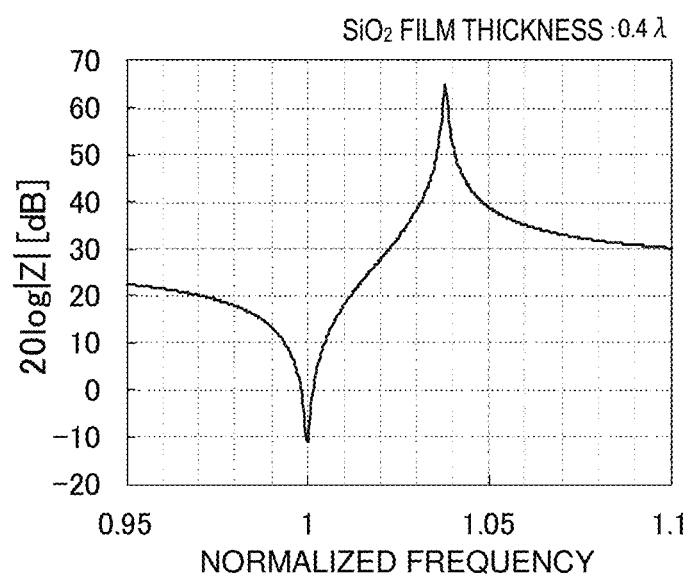
FIG. 9A is a graph showing impedance characteristics of a case where a thickness of an $SiO_2$ film is about $0.4\lambda$.
Figure 9B:
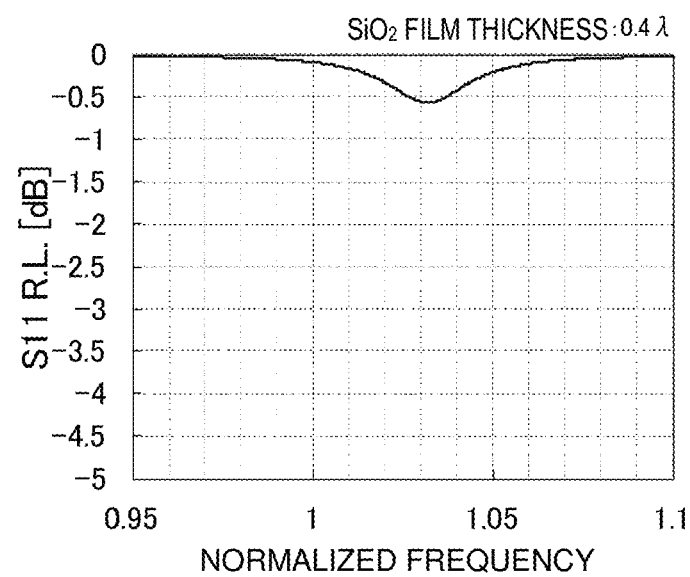
FIG. 9B is a graph showing return loss characteristics thereof.
Figure 10A:
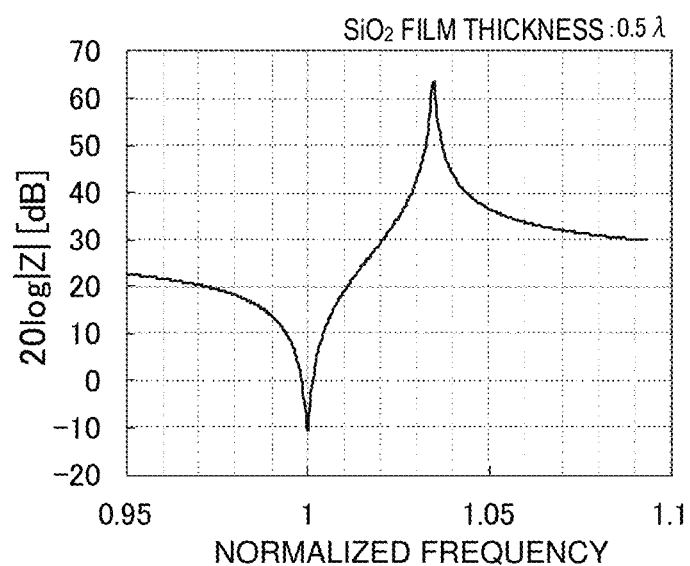
FIG. 10A is a graph showing impedance characteristics of a case where a thickness of an $SiO_2$ film is about $0.5\lambda$.
Figure 10B:
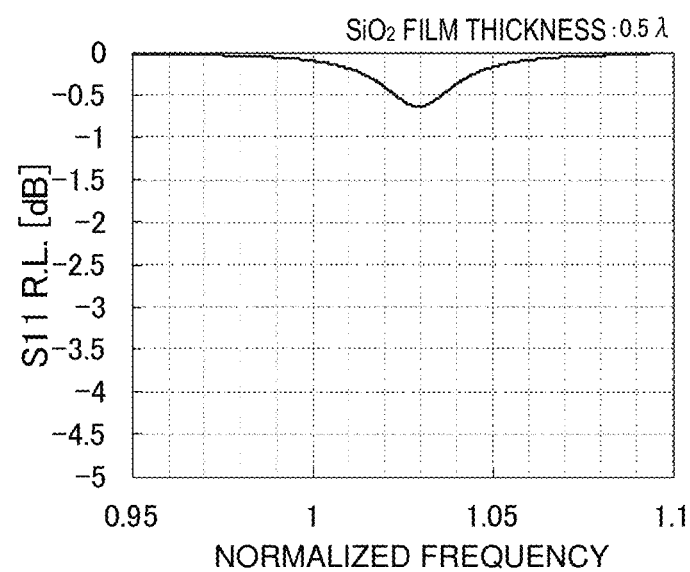
FIG. 10B is a graph showing return loss characteristics thereof.
Figure 11A:
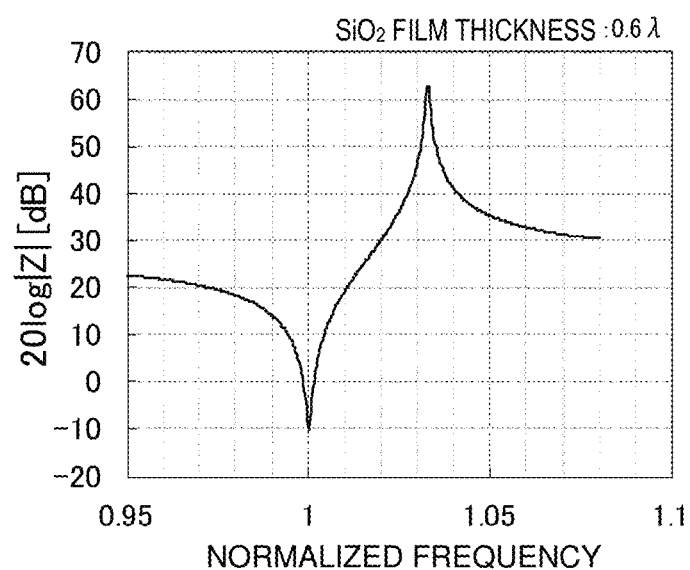
FIG. 11A is a graph showing impedance characteristics of a case where a thickness of an $SiO_2$ film is about $0.6\lambda$.
Figure 11B:
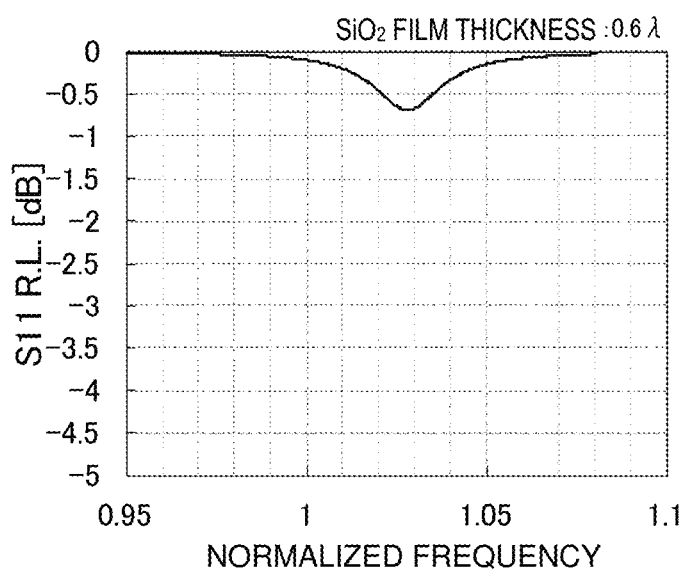
FIG. 11B is a graph showing return loss characteristics thereof.
Figure 12A:
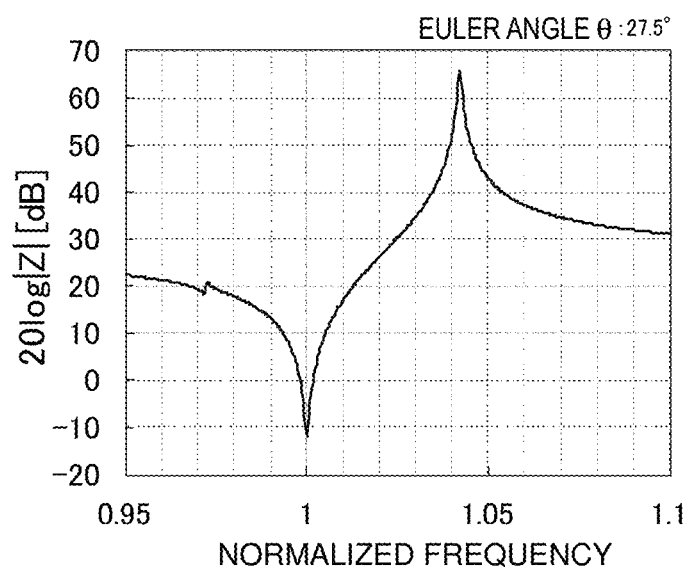
FIG. 12A is a graph showing impedance characteristics of a case where $\theta$ of Euler angles is about 27.5°.
Figure 12B:
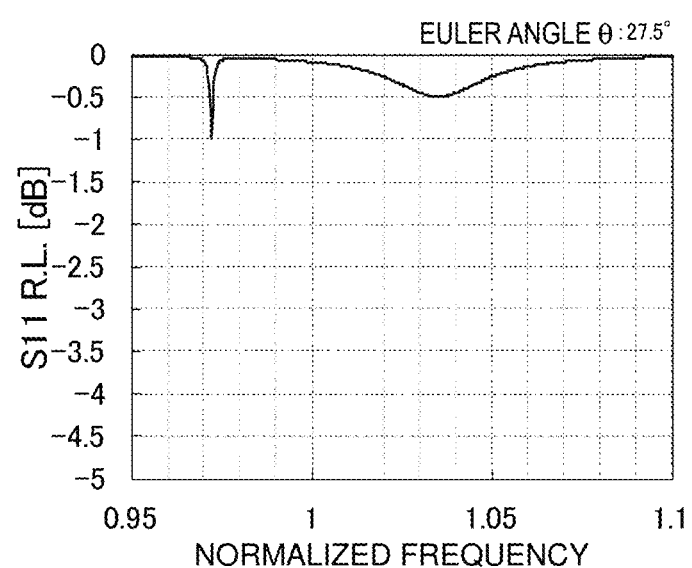
FIG. 12B is a graph showing return loss characteristics thereof.
Figure 13A:
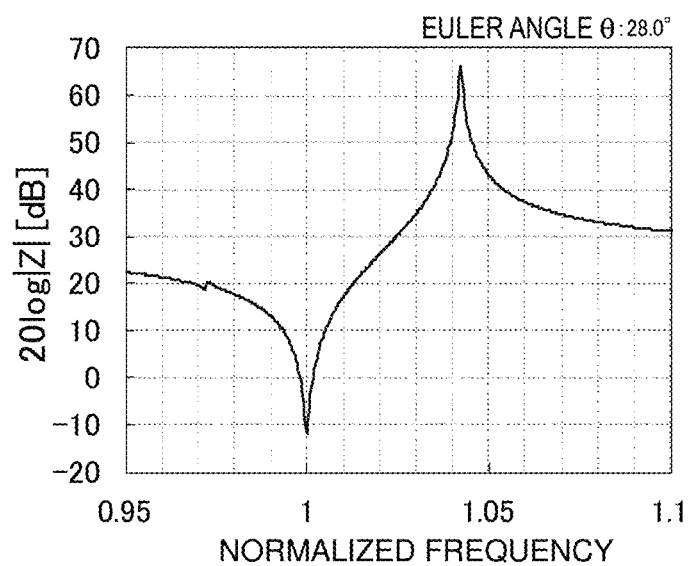
FIG. 13A is a graph showing impedance characteristics of a case where $\theta$ of Euler angles is about 28.0°.
Figure 13B:
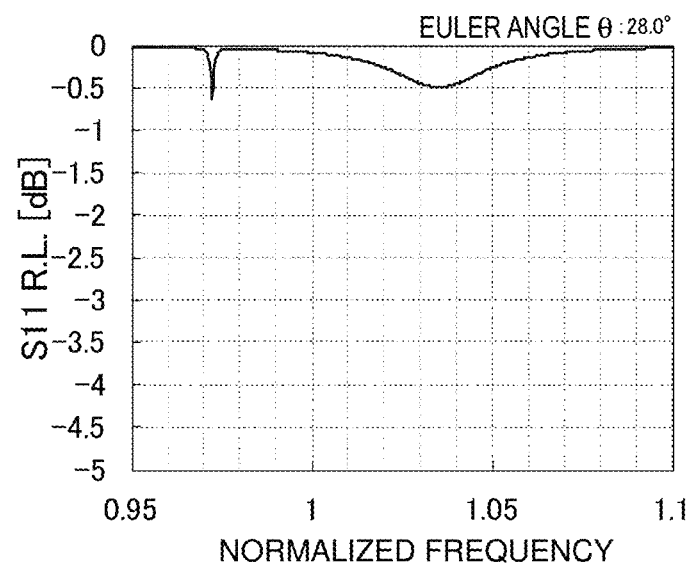
FIG. 13B is a graph showing return loss characteristics thereof.
Figure 14A:
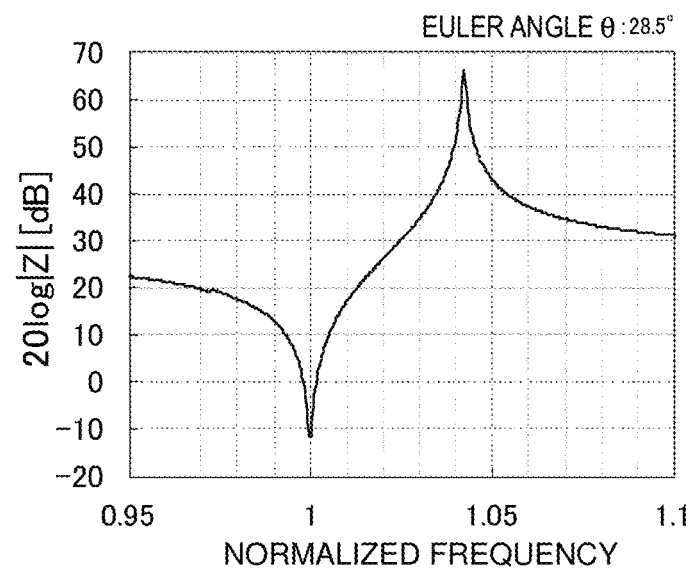
FIG. 14A is a graph showing impedance characteristics of a case where $\theta$ of Euler angles is about 28.5°.
Figure 14B:
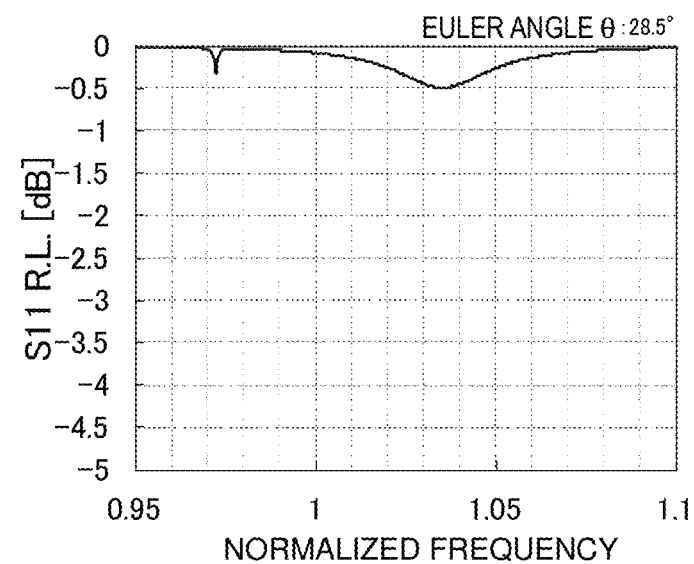
FIG. 14B is a graph showing return loss characteristics thereof.
Figure 15A:
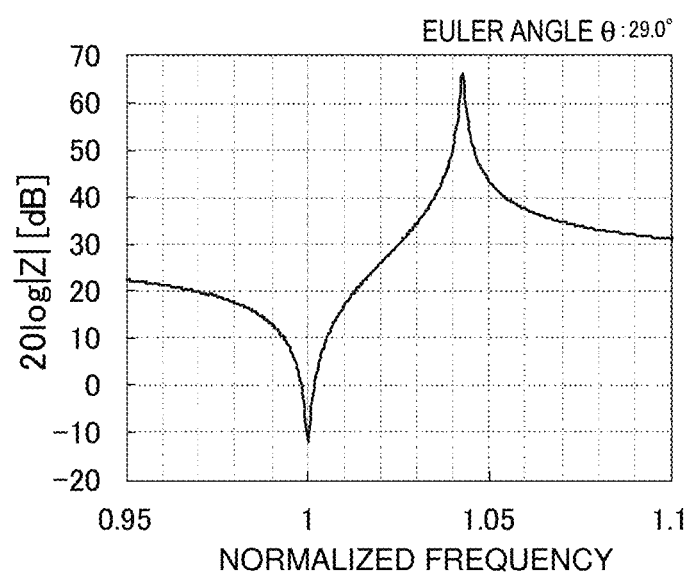
FIG. 15A is a graph showing impedance characteristics of a case where $\theta$ of Euler angles is about 29.0°.
Figure 15B:
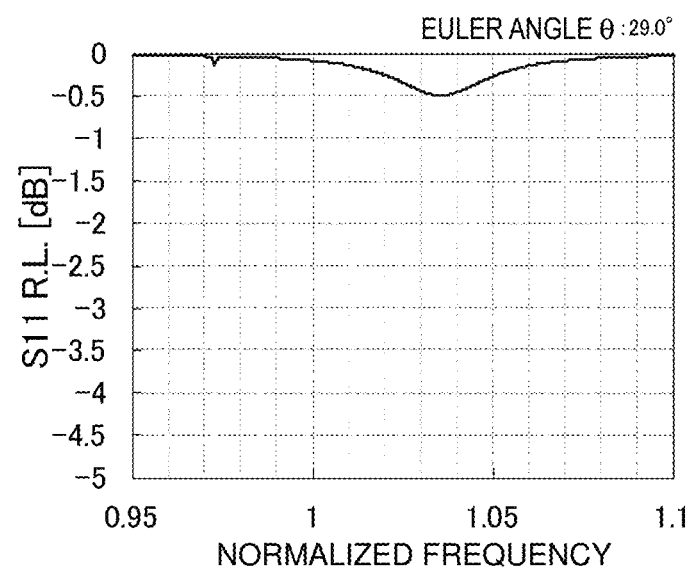
FIG. 15B is a graph showing return loss characteristics thereof.

As illustrated in FIGS. 5 and 6, when the propagation direction A2 of the elastic wave in the second elastic wave resonator 30 is slanted, the parallel arm resonators P1 to P4 each defined by the elastic wave resonator 30 are slanted by the same or substantially the same angle.

As illustrated in FIG. 5, when the parallel arm resonators P1 to P4 are slanted by about 1°, the parallel arm resonators P1 to P4 do not reach the end portion 2b where the electrode pattern is not able to be provided. On the other hand, as illustrated in FIG. 6, when the parallel arm resonators P1 to P4 are slanted by about 2°, the parallel arm resonators P1 to P4 reach the end portion 2b where the electrode pattern is not able to be provided. When the parallel arm resonators P1 to P4 are slanted by about 2°, they may overlap with the series arm resonators S1 to S4 or pattern wiring 15. Accordingly, when the parallel arm resonators P1 to P4 are slanted by about 2° or more, a space that includes the resonators or the pattern wiring 15 is enlarged, and miniaturization is not able to be easily provided. In a case where the width of the pattern wiring 15 is reduced in order to secure the space, electrical resistance of the pattern wiring 15 is increased, and the characteristics of the elastic wave device 1 may be deteriorated.

In contrast, in the present preferred embodiment, the angle between the propagation direction A1 of the elastic wave in the first elastic wave resonator 20 and the propagation direction A2 of the elastic wave in the second elastic wave resonator 30 falls within a range smaller than about 2°, and the propagation directions A1 and A2 coincide with each other. Therefore, the elastic wave device 1 is able to be reduced in size, and the deterioration in characteristics is unlikely to occur.

Next, with reference to FIGS. 7A to 23, spurious noise caused by SH waves being significantly reduced or prevented by setting $\theta$ of the Euler angles of the LiNbO$_3$ substrate 2 within a specific range is described.

First, with the structure illustrated in FIG. 3, an elastic wave resonator is designed as follows. In the designed elastic wave resonator, the close contact layers 41, 43, and 45 are not included.

LiNbO$_3$ substrate 2—Euler angles (0°, 30°, 0°)
First IDT electrode 21—duty ratio: about 0.60
Main electrode 42—Pt film, thickness: about 0.075$\lambda$
Conductive auxiliary film 44—Al film, thickness: about 0.08$\lambda$,
First dielectric film 22—SiO$_2$ film, thickness: adjusted in a range of about 0.2$\lambda$ to about 0.6$\lambda$
First frequency adjustment film 23—SiN film, thickness: about 0.01$\lambda$
Elastic wave—Rayleigh wave In the elastic wave resonator designed under the above conditions, $\theta$ of the Euler angles is fixed to about 30°, the thickness of the SiO$_2$ film is varied within the range of about 0.2$\lambda$ to about 0.6$\lambda$, and impedance characteristics and return loss characteristics are measured.

FIGS. 7A, 8A, 9A, 10A, and 11A are graphs showing impedance characteristics when the thickness of the SiO$_2$ film is varied, and FIGS. 7B, 8B, 9B, 10B, and 11B are graphs showing return loss characteristics thereof. The thickness of the SiO$_2$ film is 0.2λ, 0.3λ, 0.4λ, 0.5λ, and 0.6λ in that order in FIGS. 7A to 11B.

As is apparent from FIGS. 7A to 11B, when θ of the Euler angles is about 30°, spurious noise caused by SH waves is significantly reduced or prevented in a vicinity of the band regardless of the thickness of the SiO$_2$ film.

Next, in the designed elastic wave resonator, the thickness of the SiO$_2$ film is fixed to 0.3λ, θ of the Euler angles is varied within a range of about 27.5° to about 31.5°, and impedance characteristics and return loss characteristics are measured.

In FIGS. 12A to 20B, each of FIGS. 12A, 13A, 14A, 15A, 16A, 17A, 18A, 19A, and 20A is a graphs showing impedance characteristics when θ of the Euler angles is varied, and each of FIGS. 12B, 13B, 14B, 15B, 16B, 17B, 18B, 19B, and 20B is a graph showing return loss characteristics thereof. Note that, θ of the Euler angles is about 27.5°, about 28.0°, about 28.5°, about 29.0°, about 29.5°, about 30.0°, about 30.5°, about 31.0°, and about 31.5° in that order in FIGS. 12A to 20B.

Figure 16A:
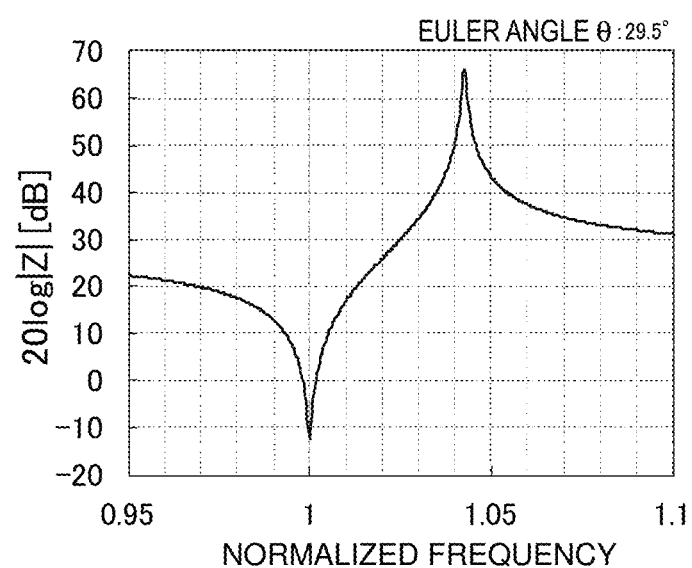
FIG. 16A is a graph showing impedance characteristics of a case where $\theta$ of Euler angles is about 29.5°.
Figure 16B:
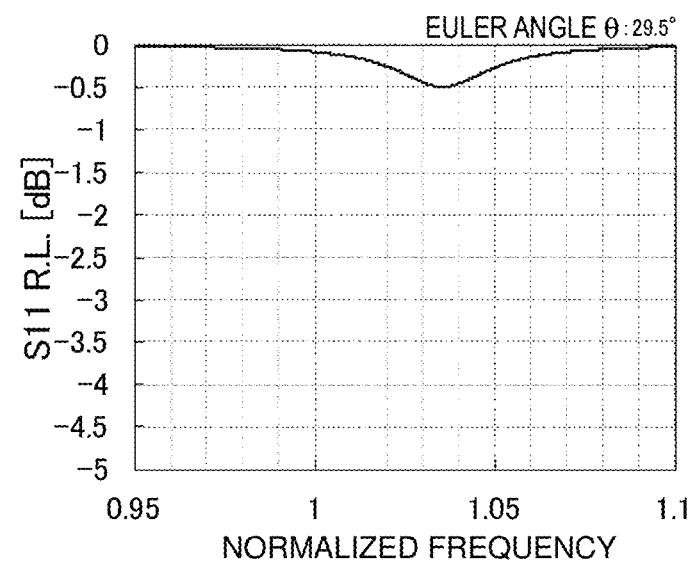
FIG. 16B is a graph showing return loss characteristics thereof.
Figure 17A:
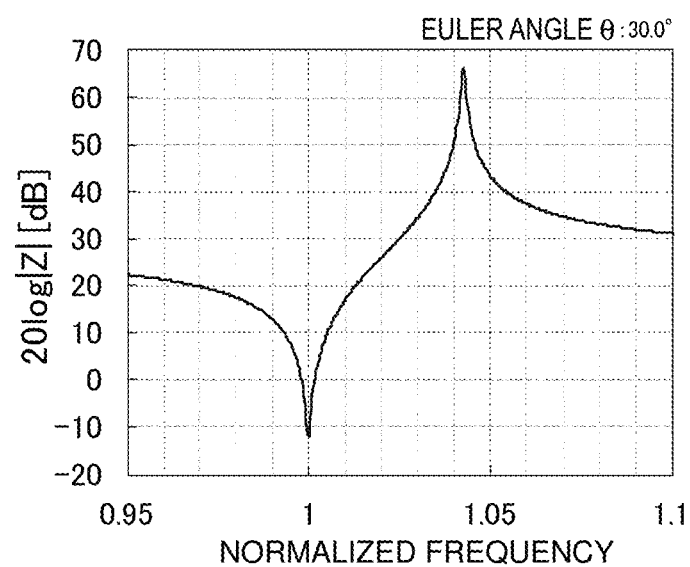
FIG. 17A is a graph showing impedance characteristics of a case where $\theta$ of Euler angles is about 30.0°.
Figure 17B:
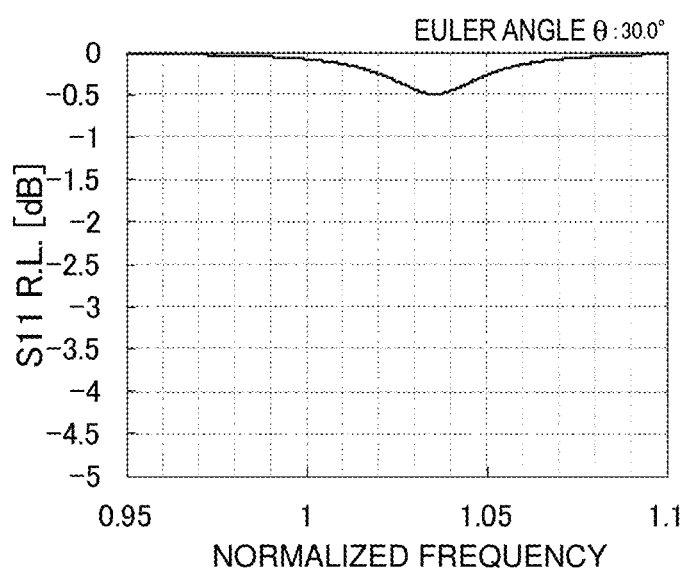
FIG. 17B is a graph showing return loss characteristics thereof.
Figure 18A:
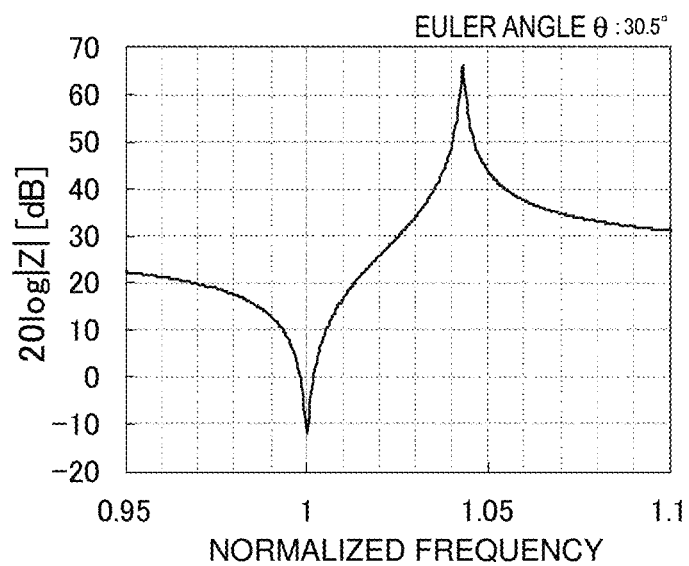
FIG. 18A is a graph showing impedance characteristics of a case where $\theta$ of Euler angles is about 30.5°.
Figure 18B:
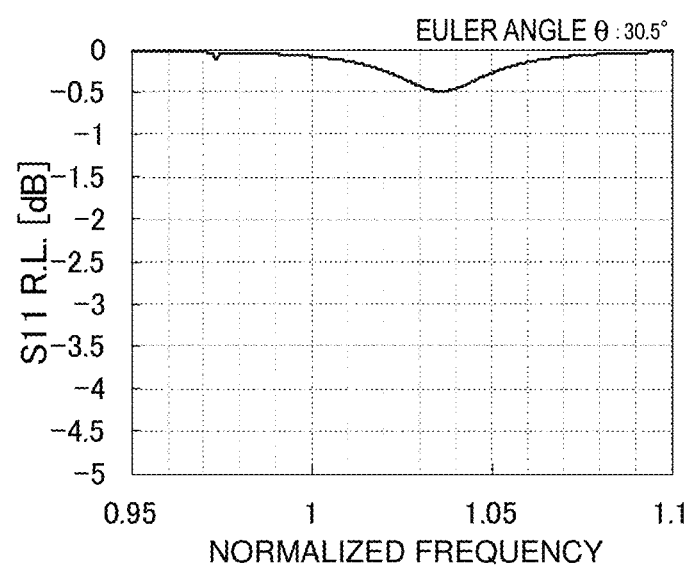
FIG. 18B is a graph showing return loss characteristics thereof.
Figure 19A:
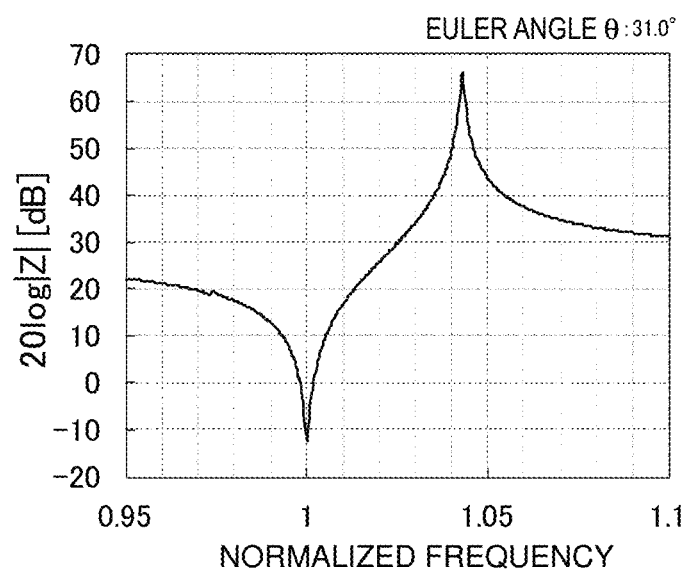
FIG. 19A is a graph showing impedance characteristics of a case where $\theta$ of Euler angles is about 31.0°.
Figure 19B:
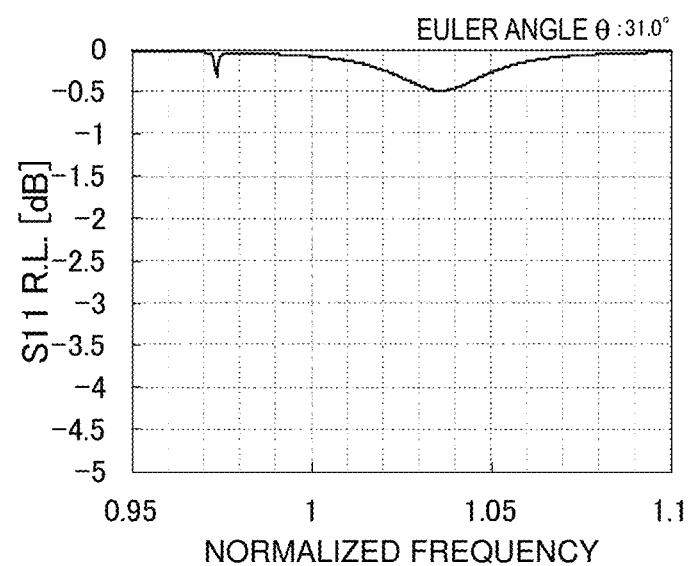
FIG. 19B is a graph showing return loss characteristics thereof.
Figure 20A:
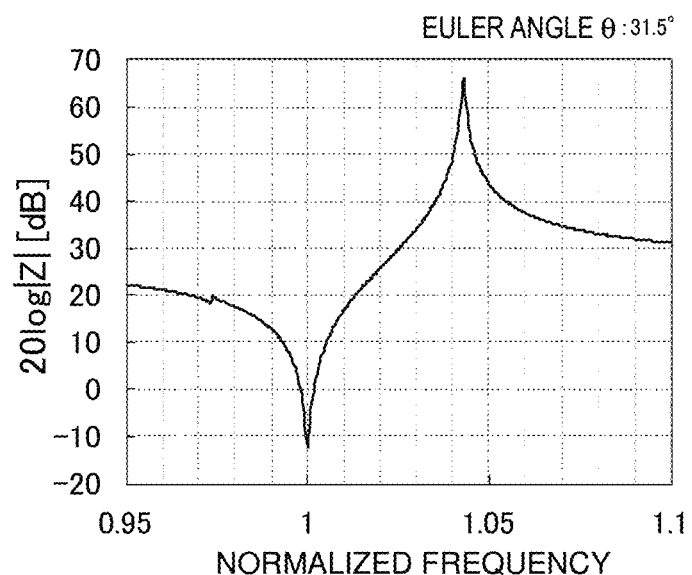
FIG. 20A is a graph showing impedance characteristics of a case where $\theta$ of Euler angles is about 31.5°.
Figure 20B:
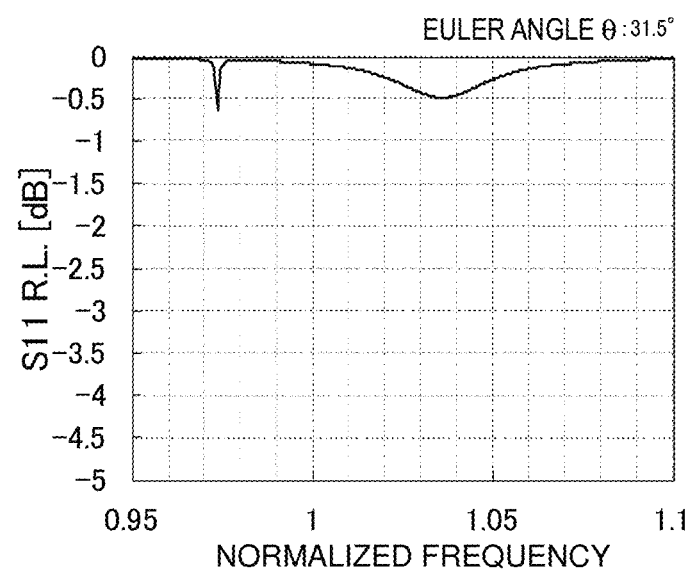
FIG. 20B is a graph showing return loss characteristics thereof.

As is apparent from FIGS. 16A and 16B (θ=29.5°) and FIGS. 17A and 17B (θ=30.0°), when θ of the Euler angles is equal to or larger than about 29.5° and equal to or smaller than about 30.0°, substantially no spurious noise caused by SH waves is generated. However, in a case of manufacturing an elastic wave device including a one-port type elastic wave resonator, a problem may occur when an absolute value of the magnitude of spurious noise caused by SH waves is greater than about 0.3 dB. Therefore, it is preferable for the magnitude of spurious noise to be equal to or smaller than about 0.3 dB in an absolute value. As understood from FIGS. 12 to 20, θ of the Euler angles is equal to or larger than about 28.5° and equal to or smaller than about 31.0° when the absolute value of the magnitude of spurious noise caused by SH waves becomes equal to or smaller than about 0.3 dB.

Figure 21:
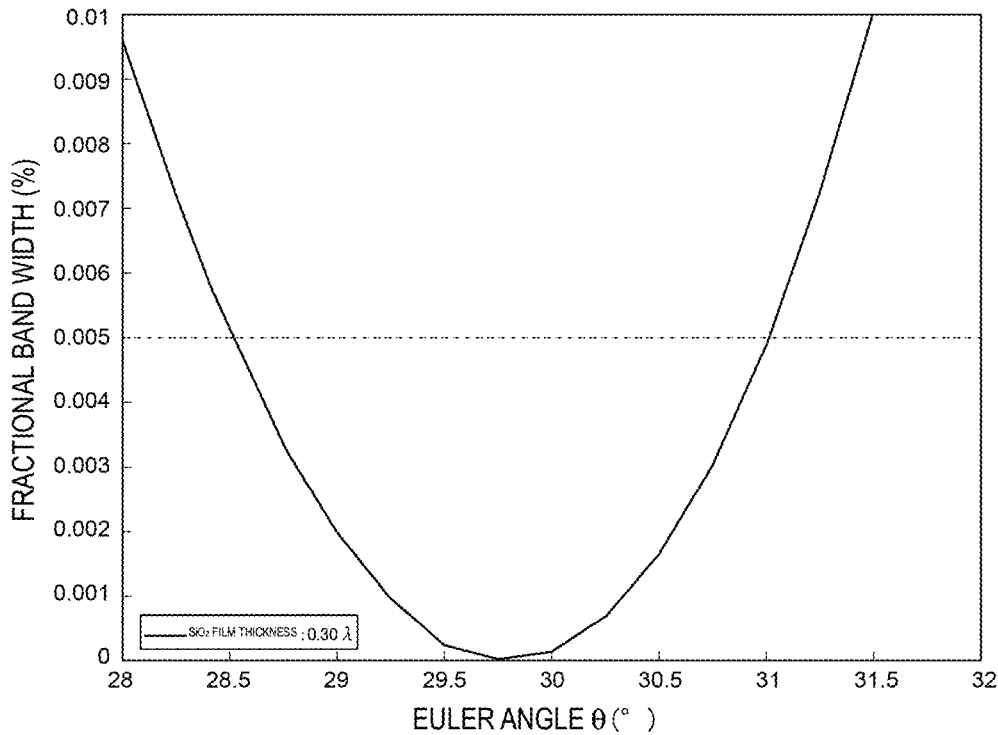
FIG. 21 is a graph showing a relationship between $\theta$ of Euler angles and a fractional band width of SH waves.

FIG. 21 is a graph showing a relationship between θ of Euler angles and a fractional band width of SH waves. FIG. 21 shows a result provided when an elastic wave resonator of the same or substantially the same design as the design in FIGS. 12A to 20B is included. The fractional band width of SH waves is a value indicating the magnitude of spurious noise cause by the SH waves. FIG. 21 shows that, when θ of the Euler angles is equal to or larger than about 28.5° and equal to or smaller than about 31.0°, the fractional band width of the SH waves is equal to or smaller than about 0.005%. From this, it is understood that, when the fractional band width of the SH waves is equal to or smaller than about 0.005%, the spurious noise caused by the SH waves is able to be sufficiently reduced. Accordingly, the range of θ of the Euler angles in which the fractional band width of the SH waves is equal to or smaller than about 0.005%, is a range of θ of the Euler angles capable of sufficiently reducing the spurious noise caused by the SH waves.

In particular, in the present preferred embodiment, since the elastic wave resonators including SiO$_2$ films of different thicknesses are provided, it is sufficient to determine a range of θ of the Euler angles in which the fractional band width of SH waves becomes equal to or less than about 0.005% regardless of the thickness of the SiO$_2$ film. The range of θ of the Euler angles in which the fractional band width of SH waves becomes equal to or less than about 0.005% regardless of the thickness of the SiO$_2$ film, is a range of θ of the Euler angles capable of sufficiently reducing spurious noise caused by SH waves regardless of the thickness of the SiO$_2$ film.

Figure 22:
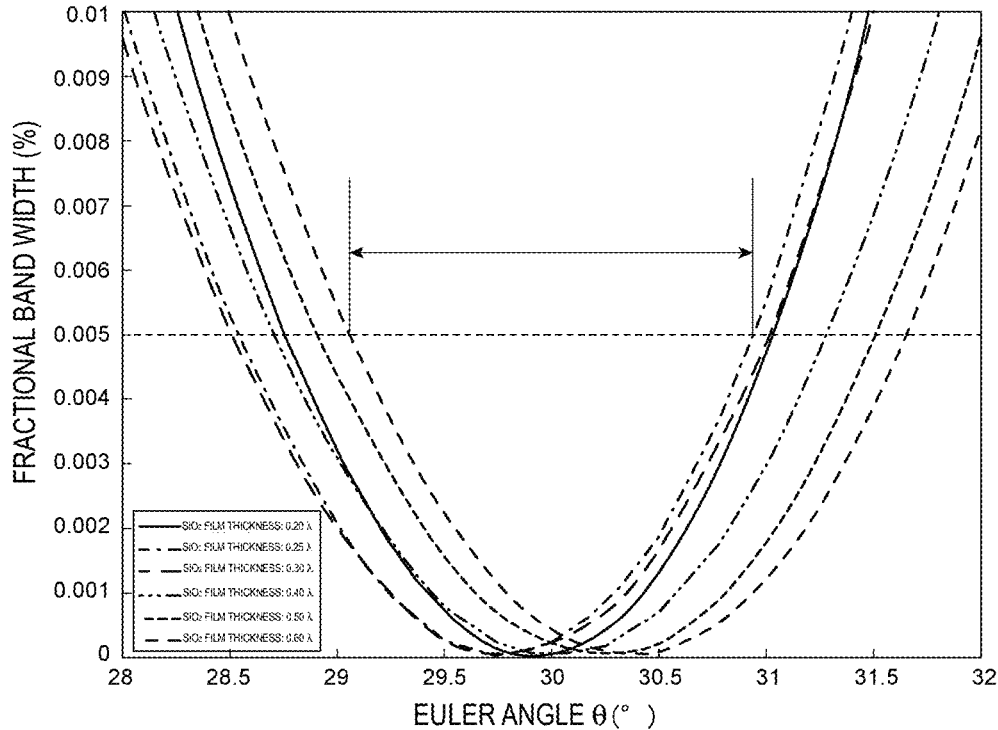
FIG. 22 is a graph showing a relationship between $\theta$ of Euler angles and a fractional band width of SH waves when the thickness of an $SiO_2$ film is varied.

FIG. 22 is a graph showing a relationship between θ of Euler angles and a fractional band width of SH waves when the thickness of the SiO$_2$ film is varied. Note that FIG. 22 shows a result provided when an elastic wave resonator of the same or substantially the same design as the design in FIG. 21 is included, except that the thickness of the SiO$_2$ film is varied.

Although an electromechanical coupling coefficient of SH waves is different depending on the thickness of the SiO$_2$ film, it is understood from FIG. 22 that, when θ of the Euler angles is equal to or larger than about 29.1° and equal to or smaller than about 30.9°, spurious noise caused by the SH waves is able to be sufficiently reduced regardless of the thickness of the SiO$_2$ film.

Similarly, a lower limit value and an upper limit value of θ of Euler angles provided by varying the thickness of a Pt film, which is the main electrode 42, are shown in Table 1 below. The lower limit values and the upper limit values of θ of the above-mentioned Euler angles are values at which the fractional band width of SH waves becomes equal to or smaller than about 0.005% regardless of the thickness of the SiO$_2$ film.

TABLE 1

| Pt film thickness (λ) | Lower limit value of θ (°) | Upper limit value of θ (°) |
|---|---|---|
| 0.055 | 28.15 | 28.2 |
| 0.06 | 28.55 | 29.45 |
| 0.065 | 28.8 | 30.15 |
| 0.07 | 28.95 | 30.6 |
| 0.075 | 29.1 | 30.9 |
| 0.08 | 29.2 | 31.15 |
| 0.085 | 29.25 | 31.3 |
| 0.09 | 29.3 | 31.45 |
| 0.095 | 29.35 | 31.55 |
| 0.1 | 29.4 | 31.6 |

Figure 23:
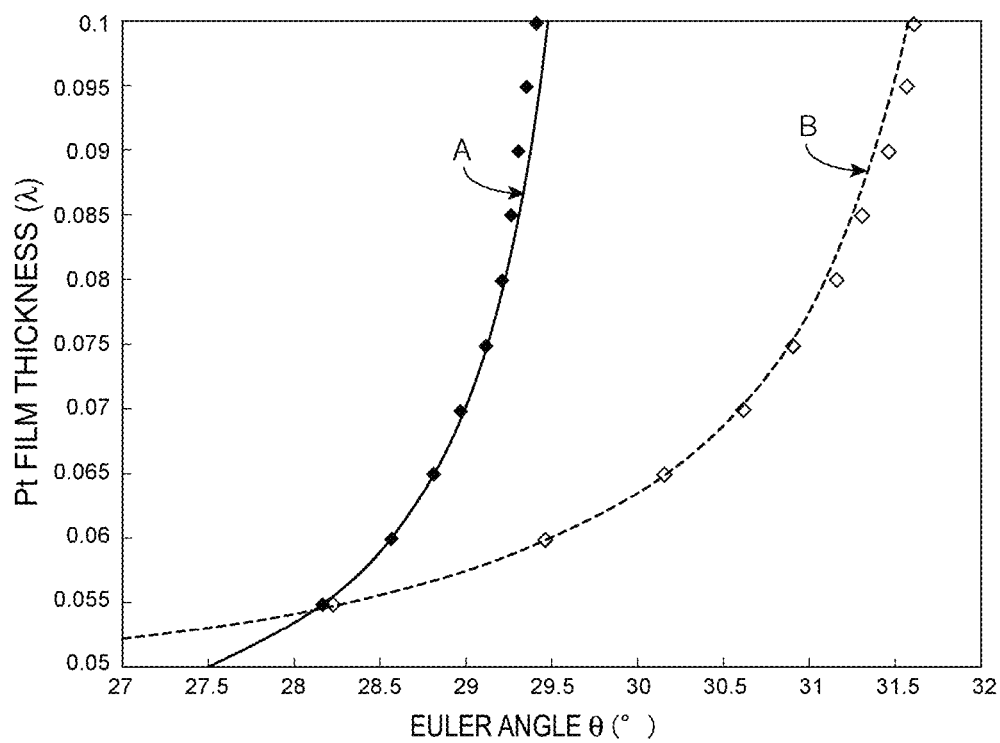
FIG. 23 is a graph showing a relationship between $\theta$ of Euler angles and a thickness of a Pt film.

FIG. 23 is a graph showing a relationship between θ of Euler angles and the thickness of a Pt film. Note that FIG. 23 is a graph in which the Pt film thicknesses and the lower and upper limit values of θ of the Euler angles in Table 1 are plotted. A curved line indicated by an arrow A in FIG. 23 is a curved line provided by plotting the lower limit values of θ of the Euler angles. The curved line indicated by the arrow A is represented by an expression of $-0.033/(T_{Pt}-0.037)+29.99$, where $T_{pt}$ is the thickness of the Pt film. A curved line indicated by an arrow B in FIG. 23 is a curved line provided by plotting the upper limit values of θ of the Euler angles. The curved line indicated by the arrow B is represented by an expression of $-0.050/(T_{Pt}-0.043)+32.45$, where $T_{pt}$ is the thickness of the Pt film. In FIG. 23, a region surrounded by the curved line indicated by the arrow A and the curved line indicated by the arrow B is a region in which the spurious noise caused by the SH waves is able to be sufficiently reduced. The following expression (2) represents the above-mentioned region where the spurious noise caused by the SH waves is able to be sufficiently reduced.

$$-0.033/(T_{Pt}-0.037)+29.99 \le \theta \le -0.050/(T_{Pt}-0.043)+32.45 \quad \text{expression (2)}$$

An intersection point between the curved line indicated by the arrow A and the curved line indicated by the arrow B corresponds to the lower limit value of the thickness of the Pt film, which is about 0.055λ. In a case where the thickness of the Pt film defining and functioning as the main electrode 42 becomes excessively large, the aspect ratio of the IDT electrode becomes large, and the IDT electrode is not able to be easily formed. Further, since there is a risk of causing voids, cracks, or the like to be generated in the dielectric film on the IDT electrode, the upper limit of the Pt film thickness is determined to be 0.10λ.

In a case where a metal other than Pt is included as a material of the main electrode 42, the thickness of the main electrode 42 is changed by an amount of the density ratio of the metal and Pt. To be specific, in a case where the main electrode 42 of density ρ is included, the thickness T of the main electrode 42 is set as follows: $T=T_{Pt}\times(\rho_{Pt}/\rho)$. Note that, $\rho_{Pt}$ is the density of Pt. In a case where $\rho/\rho_{Pt}$ is taken as r (i.e., $r=\rho/\rho_{Pt}$) and an expression of $T_{Pt}=T/(\rho_{Pt}/\rho)$ is substituted into the expression (2), the result is represented with the following expression (1).

$$-0.033/(T\times r-0.037)+29.99 \le \theta \le -0.050/(T\times r-0.043)+32.45 \quad (1)$$

Note that (T×r) is set within a range of about 0.055λ ≤T×r≤ about 0.10λ.

From the above, it is understood that, by setting θ of the Euler angles within the range represented by the above expression (1), the spurious noise caused by the SH waves is able to be significantly reduced or prevented regardless of the thickness of the $SiO_2$ film. Since the spurious noise caused by the SH waves is able to be significantly reduced or prevented regardless of the thickness of the $SiO_2$ film, even in a case where the thicknesses of the first dielectric film 22 and the second dielectric film 32 are different from each other as in the elastic wave device 1, the spurious noise caused by the SH waves is able to be significantly reduced or prevented.

Although FIGS. 7A to 23 show the results when the Euler angles (φ, θ, ψ) are (0°, θ, 0°), similar results are able to be provided also in a range of (0°±5°, θ, 0°±10°).

Next, with reference to FIGS. 24A to 26B, spurious noise different from the spurious noise caused by the SH waves being further significantly reduced or prevented by setting ψ of Euler angles (φ, θ, ψ) to be within a specific range is described.

FIGS. 24A to 26B show the results provided when an elastic wave resonator designed as described below is used. In the designed elastic wave resonator, the close contact layers 41, 43, and 45 are not included.

$LiNbO_3$ substrate 2—Euler angles (0°, 30°, ψ°)
First IDT electrode 21—duty ratio: about 0.60
Main electrode 42—Pt film, thickness: about 0.075λ
Conductive auxiliary film 44—Al film, thickness: about 0.08λ
First dielectric film 22—$SiO_2$ film, thickness: about 0.3λ
First frequency adjustment film 23—SiN film, thickness: about 0.01λ

Figure 24A:
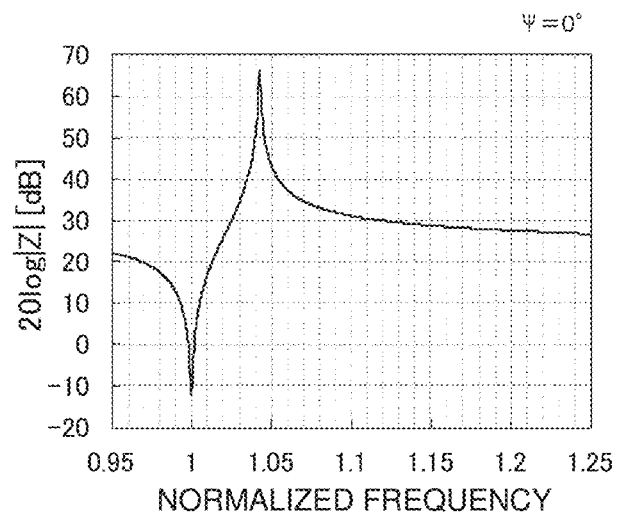
FIG. 24A is a graph showing impedance characteristics of a case where $\psi$ of Euler angles is about 0°.
Figure 24B:
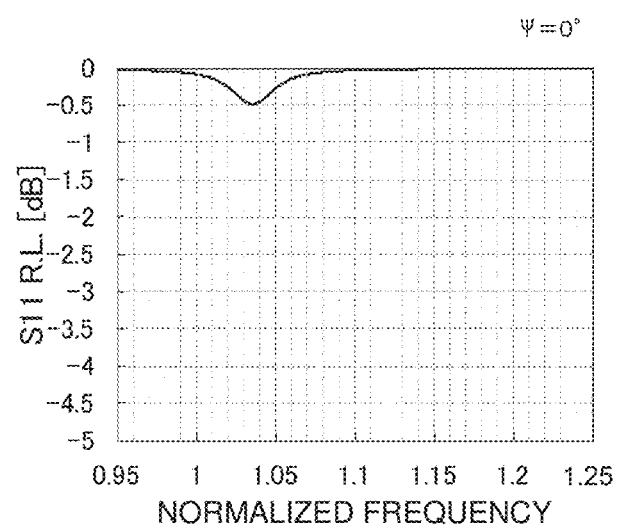
FIG. 24B is a graph showing return loss characteristics thereof.
Figure 25A:
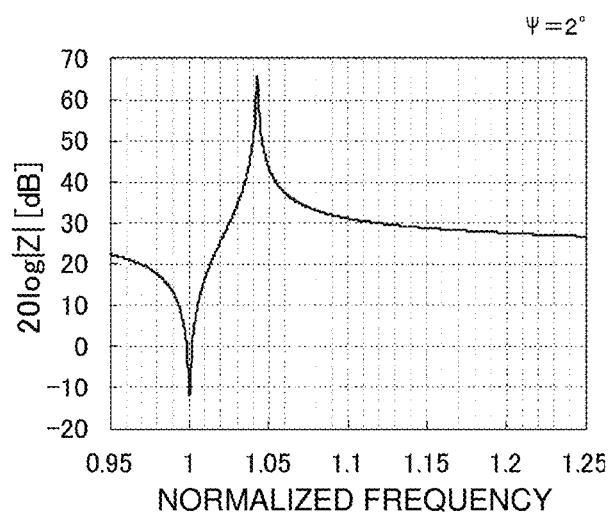
FIG. 25A is a graph showing impedance characteristics of a case where $\psi$ of Euler angles is about 2°.
Figure 25B:
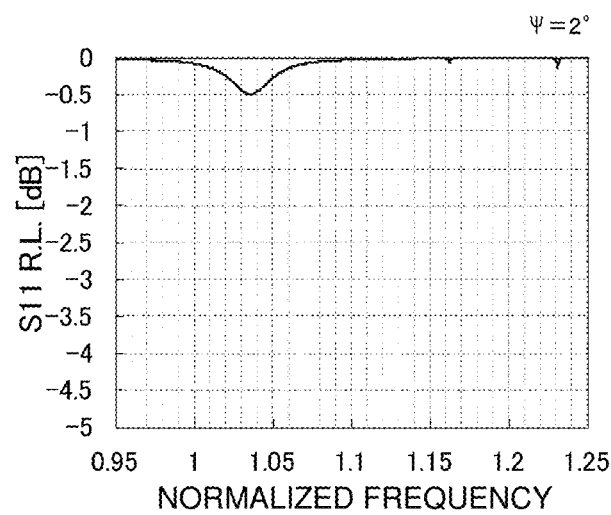
FIG. 25B is a graph showing return loss characteristics thereof.
Figure 26A:
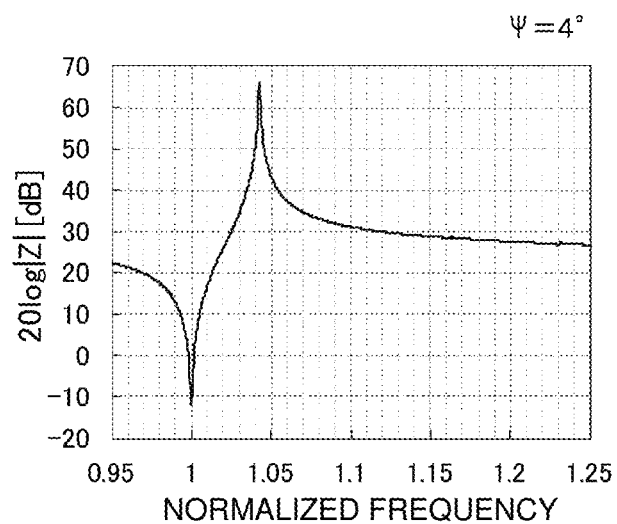
FIG. 26A is a graph showing impedance characteristics of a case where $\psi$ of Euler angles is about 4°.
Figure 26B:
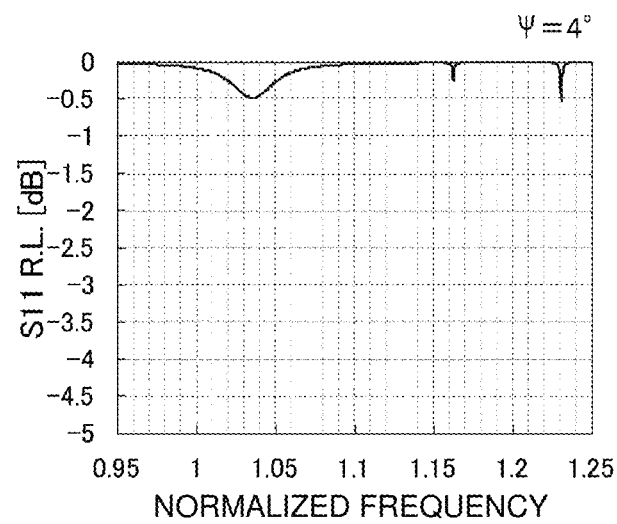
FIG. 26B is a graph showing return loss characteristics thereof.

Each of FIGS. 24A, 25A, and 26A is a graph showing impedance characteristics when ψ of the Euler angles is varied, and each of FIGS. 24B, 25B, and 26B is a graph showing return loss characteristics thereof. Note that, ψ of the Euler angles is about 0°, about 2°, and about 4° in that order in FIGS. 24A to 26B. From FIGS. 24A to 26B, it is understood that large spurious noise is generated near a normalized frequency 1.16 and near a normalized frequency 1.23 when the Euler angle ψ is varied by about 4°. On the other hand, it is understood that, when the Euler angle ψ is varied by about 2° or less, spurious noise near the normalized frequency 1.16 and near the normalized frequency 1.23 is significantly reduced or prevented.

The above-described spurious noise is spurious noise generated due to the symmetry of the $LiNbO_3$ substrate being broken with respect to the propagation direction of the elastic wave by shifting the Euler angle ψ from 0°. Therefore, it is preferable, for example, for ψ to be close to 0°.

From this, it is understood that, by setting the Euler angle ψ to be within a range from about −2° to about 2°, spurious noise different from the spurious noise caused by the SH waves is able to be further significantly reduced or prevented.

High Frequency Front-End Circuit and Communication Apparatus

The elastic wave device of the preferred embodiment described above is able to be included as a duplexer of a high frequency front-end circuit or the like. This example will be described below.

Figure 27:
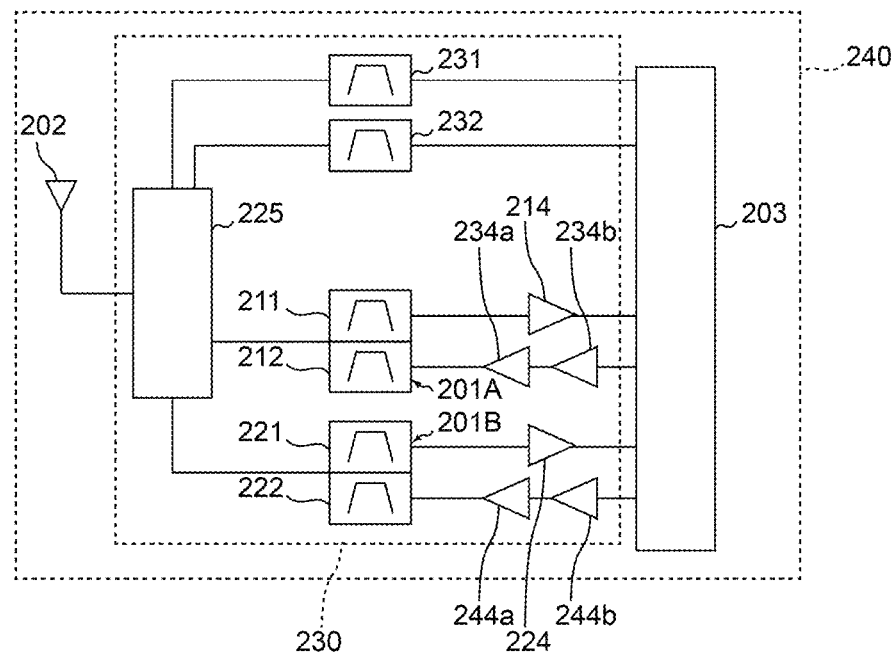
FIG. 27 is a diagram of a communication apparatus and a high frequency front-end circuit according to a preferred embodiment of the present invention.

FIG. 27 is a diagram of a communication apparatus and a high frequency front-end circuit according to a preferred embodiment of the present invention. In FIG. 27, components and elements connected with a high frequency front-end circuit 230, such as an antenna element 202 and an RF signal processing circuit (RFIC) 203, are also illustrated. The high frequency front-end circuit 230 and the RF signal processing circuit 203 define a communication apparatus 240. The communication apparatus 240 may include a power supply, a CPU, a display, and the like, for example.

The high frequency front-end circuit 230 includes a switch 225, duplexers 201A and 201B, filters 231 and 232, low-noise amplification circuits 214 and 224, and power amplification circuits 234a, 234b, 244a, and 244b. Note that the high frequency front-end circuit 230 and the communication apparatus 240 illustrated in FIG. 27 are examples of a high frequency front-end circuit and a communication apparatus, and are not limited to this specific configuration and arrangement.

The duplexer 201A includes filters 211 and 212. The duplexer 201B includes filters 221 and 222. The duplexers 201A and 201B are connected to the antenna element 202 via a switch 225. The elastic wave device described above may define and function as the duplexers 201A and 201B, and may define and function as the filters 211, 212, 221, and 222.

Further, the elastic wave device described above is also able to be applied to a multiplexer including three or more filters, such as a triplexer in which an antenna terminal for three filters is shared and a hexaplexer in which an antenna terminal for six filters is shared.

In other words, the elastic wave device described above includes an elastic wave resonator, a filter, a duplexer, and a multiplexer including three or more filters. The multiplexer is not limited to both a transmission filter and a reception filter, and may include only a transmission filter or only a reception filter.

The switch 225 connects the antenna element 202 to a signal path corresponding to a predetermined band controlled by a control signal from a control unit (not illustrated), and is preferably defined by, for example, a single pole double throw (SPDT) type switch. The number of signal paths connected to the antenna element 202 is not limited to one, and there may be a plurality of signal paths. That is, the high frequency front-end circuit 230 may correspond to carrier aggregation.

The low-noise amplification circuit 214 is a reception amplification circuit that amplifies a high frequency signal (in this case, a high frequency reception signal) traveling through the antenna element 202, the switch 225 and the duplexer 201A, and output the amplified high frequency signal to the RF signal processing circuit 203. The low-noise amplification circuit 224 is a reception amplification circuit that amplifies a high frequency signal (in this case, a high frequency reception signal) traveling through the antenna element 202, the switch 225 and the duplexer 201B, and output the amplified high frequency signal to the RF signal processing circuit 203.

The power amplification circuits 234a and 234b are transmission amplification circuits that amplify a high frequency signal (in this case, a high frequency transmission signal) output from the RF signal processing circuit 203, and output the amplified high frequency signal to the antenna element 202 through the duplexer 201A and the switch 225. The power amplification circuits 244a and 244b are transmission amplification circuits that amplify a high frequency signal (in this case, a high frequency transmission signal) output from the RF signal processing circuit 203, and output the amplified high frequency signal to the antenna element 202 through the duplexer 201B and the switch 225.

The RF signal processing circuit 203 performs signal processing on a high frequency reception signal input from the antenna element 202 through a reception signal path by down-conversion or the like, and outputs a reception signal generated by performing the signal processing. In addition, the RF signal processing circuit 203 performs signal processing on an input transmission signal by up-conversion or the like, and outputs a high frequency transmission signal generated by performing the signal processing to the power amplification circuits 234a, 234b, 244a, or 244b. The RF signal processing circuit 203 is preferably, for example, an RFIC. The communication apparatus may include a baseband (BB) IC. In this case, the BBIC performs signal processing on the reception signal processed by the RFIC. Further, the BBIC performs signal processing on a transmission signal and outputs the processed signal to the RFIC. The reception signal processed by the BBIC and the transmission signal before being signal-processed by the BBIC are an image signal and a sound signal, for example. The high frequency front-end circuit 230 may include other circuit elements between the above-described components and elements.

The high frequency front-end circuit 230 may include duplexers according to a modification of the duplexers 201A and 201B, in place of the duplexers 201A and 201B.

Meanwhile, the filters 231 and 232 in the communication apparatus 240 are connected between the RF signal processing circuit 203 and the switch 225 via none of the low-noise amplification circuits 214, 224 and the power amplification circuits 234a, 234b, 244a and 244b. The filters 231 and 232 are also connected to the antenna element 202 via the switch 225, similarly to the duplexers 201A and 201B.

According to the high frequency front-end circuit 230 and the communication apparatus 240 provided as described above, by including an elastic wave resonator, a filter, a duplexer, a multiplexer including three or more filters, and the like, each of which is a preferred embodiment of the elastic wave device of the present invention, spurious noise caused by the SH waves is able to be significantly reduced or prevented while providing the miniaturization, to enhance the steepness in the filter characteristic, and to widen the pass band as well.

Thus far, the elastic wave devices, the high frequency front-end circuits, and the communication apparatuses according to the preferred embodiments of the present invention have been described. However, the present invention also includes other preferred embodiments provided by combining any components and elements in the above-described preferred embodiments, modifications provided by applying various modifications and variations, which are able to be conceived by those skilled in the art, on the above-described preferred embodiments without departing from the spirit and scope of the present invention, and various kinds of equipment incorporating the high frequency front-end circuit and the communication apparatus according to the present invention.

The preferred embodiments of the present invention are able to be widely applied to communication equipment such as a cellular phone, for example, as an elastic wave resonator, a filter, a duplexer, a multiplexer applicable to a multi-band system, a front-end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an $LiNbO_3$ (Lithium Niobate) substrate;
   a first elastic wave resonator including a first IDT (Interdigital Transducer) electrode provided on the $LiNbO_3$ substrate and a first dielectric film provided to cover the first IDT electrode; and
   a second elastic wave resonator including a second IDT electrode provided on the $LiNbO_3$ substrate and a second dielectric film provided to cover the second IDT electrode; wherein
   a thickness of the first dielectric film is larger than a thickness of the second dielectric film;
   the first elastic wave resonator is a series arm resonator;
   the second elastic wave resonator is a parallel arm resonator;
   a ladder filter includes at least the first elastic wave resonator and the second elastic wave resonator;
   Euler angles ($\varphi$, $\theta$, $\psi$) of the $LiNbO_3$ substrate fall within a range of (0°±5°, $\theta$, 0°±10°);
   each of the first IDT electrode and the second IDT electrode includes a main electrode that is an electrode layer that occupies a largest mass in each of the first IDT electrode and the second IDT electrode; and
   in a case where a thickness of the main electrode normalized by a wave length $\lambda$ that is determined by an electrode finger pitch of at least one of the first IDT electrode and the second IDT electrode is denoted as T, and a density ratio ($\rho/\rho Pt$) of density of the main electrode ($\rho$) to density of Pt ($\rho Pt$) is denoted as r, $\theta$ of the Euler angles ($\varphi$, $\theta$, $\psi$) of the $LiNbO_3$ substrate satisfies the following expression (1) in a range of $0.055\lambda \leq T \times r \leq 0.10\lambda$:

$$-0.033/(T \times r - 0.037) + 29.99 \leq \theta \leq -0.050/(T \times r - 0.043) + 32.45 \quad (1).$$

2. The elastic wave device according to claim 1, wherein the first IDT electrode and the second IDT electrode include a same electrode material and have a same or substantially the same thickness.

3. The elastic wave device according to claim 1, wherein $\psi$ of the Euler angles ($\varphi$, $\theta$, $\psi$) of the $LiNbO_3$ substrate falls within a range from about −2° to about 2°.

4. The elastic wave device according to claim 1, wherein each of the first dielectric film and the second dielectric film includes silicon oxide as a primary component.

5. A high frequency front-end circuit comprising:
   the elastic wave device according to claim 1; and
   a power amplifier.

6. A communication apparatus comprising:
the high frequency front-end circuit according to claim 5; and
an RF signal processing circuit.

7. An elastic wave device comprising:
an LiNbO₃ (Lithium Niobate) substrate;
a first elastic wave resonator including a first IDT (Interdigital Transducer) electrode provided on the LiNbO₃ substrate and a first dielectric film provided to cover the first IDT electrode; and
a second elastic wave resonator including a second IDT electrode provided on the LiNbO₃ substrate and a second dielectric film provided to cover the second IDT electrode; wherein
a thickness of the second dielectric film is larger than a thickness of the first dielectric film;
the first elastic wave resonator is a series arm resonator;
the second elastic wave resonator is a parallel arm resonator; and
a ladder filter includes at least the first elastic wave resonator and the second elastic wave resonator;
Euler angles ($\varphi$, $\theta$, $\psi$) of the LiNbO₃ substrate fall within a range of (0°±5°, $\theta$, 0°±10°);
each of the first IDT electrode and the second IDT electrode includes a main electrode that is an electrode layer that occupies a largest mass in each of the first IDT electrode and the second IDT electrode; and
in a case where a thickness of the main electrode normalized by a wave length $\lambda$ that is determined by an electrode finger pitch of at least one of the first IDT electrode and the second IDT electrode is denoted as T, and a density ratio ($\rho/\rho Pt$) of density of the main electrode ($\rho$) to density of Pt ($\rho Pt$) is denoted as r, $\theta$ of the Euler angles ($\varphi$, $\theta$, $\psi$) of the LiNbO₃ substrate satisfies the following expression (1) in a range of $0.055\lambda \leq T \times r \leq 0.10\lambda$:

$$-0.033/(T \times r - 0.037) + 29.99 \leq \theta \leq -0.050/(T \times r - 0.043) + 32.45 \qquad (1).$$

8. The elastic wave device according to claim 7, wherein the first IDT electrode and the second IDT electrode include a same electrode material and have a same or substantially the same thickness.

9. The elastic wave device according to claim 7, wherein $\psi$ of the Euler angles ($\varphi$, $\theta$, $\psi$) of the LiNbO₃ substrate falls within a range from about −2° to about 2°.

10. The elastic wave device according to claim 7, wherein each of the first dielectric film and the second dielectric film includes silicon oxide as a primary component.

11. A high frequency front-end circuit comprising:
the elastic wave device according to claim 7; and
a power amplifier.

12. A communication apparatus comprising:
the high frequency front-end circuit according to claim 11; and
an RF signal processing circuit.

* * * * *